(12) United States Patent
Forbes

(10) Patent No.: US 7,601,595 B2
(45) Date of Patent: Oct. 13, 2009

(54) SURROUND GATE ACCESS TRANSISTORS WITH GROWN ULTRA-THIN BODIES

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 238 days.

(21) Appl. No.: 11/557,224

(22) Filed: Nov. 7, 2006

(65) Prior Publication Data
US 2007/0066019 A1 Mar. 22, 2007

Related U.S. Application Data

(62) Division of application No. 11/175,677, filed on Jul. 6, 2005.

(51) Int. Cl.
*H01L 21/336* (2006.01)
(52) U.S. Cl. .................. 438/268; 257/E21.66
(58) Field of Classification Search ............ 438/268; 257/E21.375, E21.645, E21.626, E21.621, 257/E21.66
See application file for complete search history.

(56) References Cited

U.S. PATENT DOCUMENTS

| | | | |
|---|---|---|---|
| 3,731,287 | A | 5/1973 | Seely et al. |
| 3,732,287 | A | 5/1973 | Himmele et al. |
| 3,941,629 | A | 3/1976 | Jaffe |
| 4,139,442 | A | 2/1979 | Bondur et al. |
| 4,234,362 | A | 11/1980 | Riseman |
| 4,333,964 | A | 6/1982 | Ghezzo |
| 4,419,809 | A | 12/1983 | Riseman et al. |
| 4,432,132 | A | 2/1984 | Kinsbron et al. |
| 4,470,062 | A | 9/1984 | Muramatsu |
| 4,472,459 | A | 9/1984 | Fisher |
| 4,502,914 | A | 3/1985 | Trumpp et al. |
| 4,508,579 | A | 4/1985 | Goth et al. |

(Continued)

FOREIGN PATENT DOCUMENTS

DE 280851 7/1990

(Continued)

OTHER PUBLICATIONS

Clarke, Peter, "ISSCC: Vertical Transistor Structures Considered", EE Times Website, http://www.eetimes.com, 3 pages, Feb. 9, 2000.

(Continued)

*Primary Examiner*—W. David Coleman
(74) *Attorney, Agent, or Firm*—Knobbe, Martens, Olson & Bear, LLP

(57) ABSTRACT

A vertical transistor having an annular transistor body surrounding a vertical pillar, which can be made from oxide. The transistor body can be grown by a solid phase epitaxial growth process to avoid difficulties with forming sub-lithographic structures via etching processes. The body has ultra-thin dimensions and provides controlled short channel effects with reduced need for high doping levels. Buried data/bit lines are formed in an upper surface of a substrate from which the transistors extend. The transistor can be formed asymmetrically or offset with respect to the data/bit lines. The offset provides laterally asymmetric source regions of the transistors. Continuous conductive paths are provided in the data/bit lines which extend adjacent the source regions to provide better conductive characteristics of the data/bit lines, particularly for aggressively scaled processes.

29 Claims, 11 Drawing Sheets

U.S. PATENT DOCUMENTS

| | | |
|---|---|---|
| 4,508,757 A | 4/1985 | Fabricius et al. |
| 4,551,910 A | 11/1985 | Patterson |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |
| 4,716,131 A | 12/1987 | Okazawa et al. |
| 4,746,630 A | 5/1988 | Hui et al. |
| 4,776,922 A | 10/1988 | Battasharyya et al. |
| 4,789,560 A | 12/1988 | Yen |
| 4,838,991 A | 6/1989 | Cote et al. |
| 4,903,344 A | 2/1990 | Inoue |
| 4,959,325 A | 9/1990 | Lee et al. |
| 4,965,221 A | 10/1990 | Dennison et al. |
| 4,983,544 A | 1/1991 | Lu et al. |
| 5,013,680 A | 5/1991 | Lowrey et al. |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,087,586 A | 2/1992 | Chan et al. |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,210,046 A | 5/1993 | Crotti |
| 5,252,504 A | 10/1993 | Lowrey et al. |
| 5,260,229 A | 11/1993 | Hodges et al. |
| 5,295,092 A | 3/1994 | Hotta |
| 5,305,252 A | 4/1994 | Saeki |
| 5,316,966 A | 5/1994 | Van Der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,358,894 A | 10/1994 | Fazan et al. |
| 5,374,572 A | 12/1994 | Roth et al. |
| 5,409,563 A | 4/1995 | Cathey |
| 5,414,287 A | 5/1995 | Hong |
| 5,416,350 A | 5/1995 | Watanabe |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,497,017 A | 3/1996 | Gonzales |
| 5,502,320 A | 3/1996 | Yamada |
| 5,514,885 A | 5/1996 | Myrick |
| 5,539,229 A | 7/1996 | Noble et al. |
| 5,563,012 A | 10/1996 | Neisser |
| 5,569,620 A | 10/1996 | Linn et al. |
| 5,583,065 A | 12/1996 | Miwa |
| 5,596,759 A | 1/1997 | Miller et al. |
| 5,604,159 A | 2/1997 | Cooper et al. |
| 5,607,874 A | 3/1997 | Wang et al. |
| 5,638,318 A | 6/1997 | Seyyedy |
| 5,670,794 A | 9/1997 | Manning |
| 5,675,164 A | 10/1997 | Brunner et al. |
| 5,677,865 A | 10/1997 | Seyyedy |
| 5,679,591 A | 10/1997 | Lin et al. |
| 5,680,344 A | 10/1997 | Seyyedy |
| 5,700,733 A | 12/1997 | Manning |
| 5,705,321 A | 1/1998 | Brueck et al. |
| 5,747,377 A | 5/1998 | Wu |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,795,830 A | 8/1998 | Cronin et al. |
| 5,798,544 A | 8/1998 | Ohya et al. |
| 5,804,458 A | 9/1998 | Tehrani et al. |
| 5,821,600 A | 10/1998 | Chan |
| 5,834,359 A | 11/1998 | Jeng et al. |
| 5,841,611 A | 11/1998 | Sakakima et al. |
| 5,861,328 A | 1/1999 | Tehrani et al. |
| 5,864,496 A | 1/1999 | Mueller et al. |
| 5,892,708 A | 4/1999 | Pohm |
| 5,895,238 A | 4/1999 | Mitani |
| 5,895,273 A | 4/1999 | Burns et al. |
| 5,899,727 A | 5/1999 | Hause et al. |
| 5,902,690 A | 5/1999 | Tracy et al. |
| 5,905,285 A | 5/1999 | Gardner et al. |
| 5,907,170 A | 5/1999 | Forbes et al. |
| 5,909,618 A | 6/1999 | Forbes et al. |
| 5,909,630 A | 6/1999 | Roberts et al. |
| 5,917,745 A | 6/1999 | Fujii |
| 5,917,749 A | 6/1999 | Chen et al. |
| 5,956,267 A | 9/1999 | Hurst et al. |
| 5,963,469 A | 10/1999 | Forbes |
| 5,963,803 A | 10/1999 | Dawson et al. |
| 5,977,579 A | 11/1999 | Noble |
| 5,981,318 A | 11/1999 | Blanchard |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,008,106 A | 12/1999 | Tu et al. |
| 6,010,946 A | 1/2000 | Hisamune et al. |
| 6,042,998 A | 3/2000 | Brueck et al. |
| 6,049,106 A | 4/2000 | Forbes |
| 6,057,573 A | 5/2000 | Kirsch et al. |
| 6,063,688 A | 5/2000 | Doyle et al. |
| 6,066,191 A | 5/2000 | Tanaka et al. |
| 6,066,869 A | 5/2000 | Noble et al. |
| 6,071,789 A | 6/2000 | Yang et al. |
| 6,072,209 A | 6/2000 | Noble et al. |
| 6,077,745 A | 6/2000 | Burns et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakaima et al. |
| 6,121,148 A | 9/2000 | Bashir et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,150,688 A | 11/2000 | Maeda et al. |
| 6,157,064 A | 12/2000 | Huang |
| 6,165,833 A | 12/2000 | Parekh et al. |
| 6,172,391 B1 | 1/2001 | Goebel et al. |
| 6,174,780 B1 | 1/2001 | Robinson |
| 6,175,146 B1 | 1/2001 | Lane et al. |
| 6,191,470 B1 | 2/2001 | Forbes et al. |
| 6,211,044 B1 | 4/2001 | Xiang et al. |
| 6,229,169 B1 | 5/2001 | Hofmann et al. |
| 6,236,590 B1 | 5/2001 | Bhattacharyya et al. |
| 6,238,976 B1 | 5/2001 | Noble et al. |
| 6,246,083 B1 | 6/2001 | Noble |
| 6,265,742 B1 | 7/2001 | Gruening et al. |
| 6,271,080 B1 | 8/2001 | Mandelman et al. |
| 6,274,905 B1 | 8/2001 | Mo |
| 6,282,113 B1 | 8/2001 | DeBrosse |
| 6,288,454 B1 | 9/2001 | Allman et al. |
| 6,291,334 B1 | 9/2001 | Somekh |
| 6,297,554 B1 | 10/2001 | Lin |
| 6,306,727 B1 | 10/2001 | Akram |
| 6,316,309 B1 | 11/2001 | Holmes |
| 6,320,222 B1 | 11/2001 | Forbes et al. |
| 6,348,380 B1 | 2/2002 | Weimer et al. |
| 6,350,635 B1 | 2/2002 | Noble et al. |

| | | |
|---|---|---|
| 6,355,961 B1 | 3/2002 | Forbes |
| 6,362,057 B1 | 3/2002 | Taylor, Jr. et al. |
| 6,368,950 B1 | 4/2002 | Xiang et al. |
| 6,376,317 B1 | 4/2002 | Forbes et al. |
| 6,377,070 B1 | 4/2002 | Forbes |
| 6,383,907 B1 | 5/2002 | Hasegawa et al. |
| 6,391,782 B1 | 5/2002 | Yu |
| 6,395,613 B1 | 5/2002 | Juengling |
| 6,396,096 B1 | 5/2002 | Park et al. |
| 6,399,979 B1 | 6/2002 | Noble et al. |
| 6,403,429 B2 | 6/2002 | Noble |
| 6,404,056 B1 | 6/2002 | Kuge et al. |
| 6,413,825 B1 | 7/2002 | Forbes |
| 6,414,356 B1 | 7/2002 | Forbes et al. |
| 6,423,474 B1 | 7/2002 | Holscher |
| 6,424,001 B1 | 7/2002 | Forbes et al. |
| 6,424,561 B1 | 7/2002 | Li et al. |
| 6,440,801 B1 | 8/2002 | Furukawa et al. |
| 6,531,727 B2 | 8/2002 | Forbes et al. |
| 6,448,601 B1 | 9/2002 | Forbes et al. |
| 6,455,372 B1 | 9/2002 | Weimer |
| 6,458,662 B1 | 10/2002 | Yu |
| 6,459,119 B1 | 10/2002 | Huang et al. |
| 6,461,957 B1 | 10/2002 | Yokoyama et al. |
| 6,468,887 B2 | 10/2002 | Iwasa et al. |
| 6,475,867 B1 | 11/2002 | Hui et al. |
| 6,475,869 B1 | 11/2002 | Yu |
| 6,492,233 B2 | 12/2002 | Forbes et al. |
| 6,496,034 B2 | 12/2002 | Forbes et al. |
| 6,498,062 B2 | 12/2002 | Durcan et al. |
| 6,500,763 B2 | 12/2002 | Kim et al. |
| 6,504,201 B1 | 1/2003 | Noble et al. |
| 6,504,255 B2 | 1/2003 | Keeth |
| 6,514,884 B2 | 2/2003 | Maeda |
| 6,522,584 B1 | 2/2003 | Chen et al. |
| 6,534,243 B1 | 3/2003 | Templeton |
| 6,537,870 B1 | 3/2003 | Shen |
| 6,538,916 B2 | 3/2003 | Ohsawa |
| 6,801,056 B2 | 3/2003 | Forbes |
| 6,545,904 B2 | 4/2003 | Tran |
| 6,548,396 B2 | 4/2003 | Naik et al. |
| 6,551,878 B2 | 4/2003 | Clampitt et al. |
| 6,559,017 B1 | 5/2003 | Brown et al. |
| 6,559,491 B2 | 5/2003 | Forbes et al. |
| 6,566,280 B1 | 5/2003 | Meagley et al. |
| 6,566,682 B2 | 5/2003 | Forbes |
| 6,570,220 B2 | 5/2003 | Doyle et al. |
| 6,573,030 B1 | 6/2003 | Fairbairn et al. |
| 6,597,203 B2 | 7/2003 | Forbes |
| 6,602,779 B1 | 8/2003 | Li et al. |
| 6,617,060 B2 | 9/2003 | Weeks et al. |
| 6,617,651 B2 | 9/2003 | Ohsawa |
| 6,627,933 B2 | 9/2003 | Juengling |
| 6,632,741 B1 | 10/2003 | Clevenger et al. |
| 6,635,917 B2 | 10/2003 | Juengling |
| 6,638,441 B2 | 10/2003 | Chang et al. |
| 6,639,268 B2 | 10/2003 | Forbes et al. |
| 6,641,985 B2 | 11/2003 | Unno et al. |
| 6,645,806 B2 | 11/2003 | Roberts |
| 6,646,303 B2 | 11/2003 | Satoh et al. |
| 6,664,806 B2 | 12/2003 | Forbes et al. |
| 6,667,237 B1 | 12/2003 | Metzler |
| 6,669,165 B2 | 12/2003 | Burke et al. |
| 6,670,642 B2 | 12/2003 | Takaura et al. |
| 6,777,725 B2 | 12/2003 | Willer et al. |
| 6,673,684 B1 | 1/2004 | Huang et al. |
| 6,677,230 B2 | 1/2004 | Yokoyama et al. |
| 6,686,245 B1 | 2/2004 | Mathew et al. |
| 6,686,274 B1 | 2/2004 | Shimazu et al. |
| 6,689,695 B1 | 2/2004 | Lui et al. |
| 6,693,026 B2 | 2/2004 | Kim et al. |
| 6,696,746 B1 | 2/2004 | Farrar et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,710,387 B2 | 3/2004 | Nakamura et al. |
| 6,710,402 B2 | 3/2004 | Harada |
| 6,723,607 B2 | 4/2004 | Nam et al. |
| 6,727,168 B2 | 4/2004 | Abbortt |
| 6,734,063 B2 | 5/2004 | Willer et al. |
| 6,734,107 B2 | 5/2004 | Lai et al. |
| 6,734,482 B1 | 5/2004 | Tran et al. |
| 6,734,484 B2 | 5/2004 | Wu |
| 6,756,284 B2 | 6/2004 | Sharma |
| 6,756,625 B2 | 6/2004 | Brown |
| 6,764,949 B2 | 7/2004 | Bonser et al. |
| 6,768,663 B2 | 7/2004 | Ogata |
| 6,773,998 B1 | 8/2004 | Fisher et al. |
| 6,781,212 B1 | 8/2004 | Kao et al. |
| 6,794,699 B2 | 9/2004 | Bissey et al. |
| 6,794,710 B2 | 9/2004 | Change et al. |
| 6,797,573 B2 | 9/2004 | Brown |
| 6,798,009 B2 | 9/2004 | Forbes et al. |
| 6,800,930 B2 | 10/2004 | Jackson et al. |
| 6,806,137 B2 | 10/2004 | Tran et al. |
| 6,808,979 B1 | 10/2004 | Lin et al. |
| 6,811,954 B1 | 11/2004 | Fukuda |
| 6,825,529 B2 | 11/2004 | Chidambarrao et al. |
| 6,828,580 B2 | 12/2004 | Zhang |
| 6,835,663 B2 | 12/2004 | Lipinski |
| 6,835,988 B2 | 12/2004 | Yamashita |
| 6,844,591 B1 | 1/2005 | Tran |
| 6,844,594 B2 | 1/2005 | Juengling |
| 6,846,618 B2 | 1/2005 | Hsu et al. |
| 6,867,116 B1 | 3/2005 | Chung |
| 6,875,703 B1 | 4/2005 | Furukawa et al. |
| 6,881,627 B2 | 4/2005 | Forbes et al. |
| 6,882,006 B2 | 4/2005 | Maeda et al. |
| 6,888,187 B2 | 5/2005 | Brown et al. |
| 6,888,755 B2 | 5/2005 | Harari |
| 6,890,812 B2 | 5/2005 | Forbes et al. |
| 6,890,858 B2 | 5/2005 | Juengling et al. |
| 6,893,972 B2 | 5/2005 | Rottstegge et al. |
| 6,894,354 B2 | 5/2005 | Jono et al. |
| 6,900,521 B2 | 5/2005 | Forbes et al. |
| 6,905,628 B2 | 6/2005 | Bjarnason et al. |
| 6,924,191 B2 | 8/2005 | Lin et al. |
| 6,926,843 B2 | 8/2005 | Cantell et al. |
| 6,936,507 B2 | 8/2005 | Tang et al. |
| 6,946,709 B2 | 9/2005 | Yang |
| 6,951,709 B2 | 10/2005 | Li |
| 6,955,961 B1 | 10/2005 | Chung |
| 6,960,510 B2 | 11/2005 | Deshpande et al. |
| 6,960,832 B2 | 11/2005 | Shimazu et al. |
| 6,962,867 B2 | 11/2005 | Jackson et al. |
| 6,964,391 B2 | 11/2005 | Hiraguchi |
| 6,964,895 B2 | 11/2005 | Hsu |
| 6,967,140 B2 | 11/2005 | Doyle |
| 6,998,319 B2 | 2/2006 | Tanaka |
| 7,005,240 B2 | 2/2006 | Manger et al. |
| 7,012,024 B2 | 3/2006 | Abbott |
| 7,015,124 B1 | 3/2006 | Fisher et al. |
| 7,042,047 B2 | 5/2006 | Eppich |
| 7,045,859 B2 | 5/2006 | Amali et al. |
| 7,049,702 B2 | 5/2006 | Tseng |
| 7,056,786 B2 | 6/2006 | Yun et al. |
| 7,071,043 B2 | 7/2006 | Tang et al. |
| 7,078,296 B2 | 7/2006 | Chau et al. |
| 7,091,566 B2 | 8/2006 | Zhu et al. |
| 7,098,105 B2 | 8/2006 | Juengling |
| 7,098,536 B2 | 8/2006 | Yang et al. |
| 7,105,089 B2 | 9/2006 | Fanselow et al. |
| 7,109,544 B2 | 9/2006 | Schloesser et al. |
| 7,112,483 B2 | 9/2006 | Lin et al. |
| 7,112,815 B2 | 9/2006 | Prall |
| 7,115,525 B2 | 10/2006 | Abatchev et al. |

| | | |
|---|---|---|
| 7,118,960 B2 | 10/2006 | Tran |
| 7,119,020 B2 | 10/2006 | Okamura et al. |
| 7,122,425 B2 | 10/2006 | Chance et al. |
| 7,151,040 B2 | 12/2006 | Tran et al. |
| 7,151,690 B2 | 12/2006 | Forbes |
| 7,153,734 B2 | 12/2006 | Brask et al. |
| 7,176,109 B2 | 2/2007 | Ping et al. |
| 7,176,125 B2 | 2/2007 | Liaw |
| 7,182,823 B2 | 2/2007 | Mandigo et al. |
| 7,183,164 B2 | 2/2007 | Haller |
| 7,183,205 B2 | 2/2007 | Hong |
| 7,199,419 B2 | 4/2007 | Haller |
| 7,205,192 B2 | 4/2007 | Kweon |
| 7,205,598 B2 | 4/2007 | Voshell et al. |
| 7,208,379 B2 | 4/2007 | Venugopal et al. |
| 7,214,629 B1 | 5/2007 | Luo et al. |
| 7,226,853 B2 | 6/2007 | Bekiaris et al. |
| 7,238,580 B2 | 7/2007 | Orlowski et al. |
| 7,253,118 B2 | 8/2007 | Tran et al. |
| 7,262,089 B2 | 8/2007 | Abbott et al. |
| 7,268,054 B2 | 9/2007 | Tran et al. |
| 7,271,107 B2 | 9/2007 | Marks et al. |
| 7,285,812 B2 | 10/2007 | Tang et al. |
| 7,371,627 B1 | 5/2008 | Forbes |
| 7,372,091 B2 | 5/2008 | Leslie |
| 7,384,868 B2 | 6/2008 | Cabral et al. |
| 7,390,746 B2 | 6/2008 | Bai et al. |
| 7,393,789 B2 | 7/2008 | Abatchev et al. |
| 7,396,767 B2 | 7/2008 | Wu et al. |
| 7,396,781 B2 | 7/2008 | Wells |
| 7,413,981 B2 | 8/2008 | Tang et al. |
| 2001/0005631 A1 | 6/2001 | Kim et al. |
| 2001/0019870 A1 | 9/2001 | Noble |
| 2002/0000608 A1 | 1/2002 | Harada |
| 2002/0005590 A1 | 1/2002 | Keeth |
| 2002/0024081 A1 | 2/2002 | Gratz |
| 2002/0028541 A1 | 3/2002 | Lee et al. |
| 2002/0030214 A1 | 3/2002 | Horiguchi |
| 2002/0038886 A1 | 4/2002 | Mo |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0061639 A1 | 5/2002 | Itonaga |
| 2002/0063110 A1 | 5/2002 | Cantell et al. |
| 2002/0106772 A1 | 8/2002 | Croteau et al. |
| 2002/0121673 A1 | 9/2002 | Jono et al. |
| 2002/0123216 A1 | 9/2002 | Yokoyama et al. |
| 2002/0127810 A1 | 9/2002 | Nakamura et al. |
| 2002/0130348 A1 | 9/2002 | Tran |
| 2002/0130686 A1 | 9/2002 | Forbes |
| 2002/0135029 A1 | 9/2002 | Ping et al. |
| 2002/0158273 A1 | 10/2002 | Satoh et al. |
| 2002/0182847 A1 | 12/2002 | Yokoyama et al. |
| 2002/0187356 A1 | 12/2002 | Linthicum et al. |
| 2003/0001290 A1 | 1/2003 | Nitayama et al. |
| 2003/0006410 A1 | 1/2003 | Doyle |
| 2003/0008461 A1 | 1/2003 | Forbes et al. |
| 2003/0015757 A1 | 1/2003 | Ohsawa |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0077855 A1 | 4/2003 | Abbott |
| 2003/0085422 A1 | 5/2003 | Amali et al. |
| 2003/0119307 A1 | 6/2003 | Bekiaris et al. |
| 2003/0127426 A1 | 7/2003 | Chang et al. |
| 2003/0132480 A1 | 7/2003 | Chau et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0218199 A1 | 11/2003 | Forbes et al. |
| 2003/0227072 A1 | 12/2003 | Forbes et al. |
| 2003/0230234 A1 | 12/2003 | Nam et al. |
| 2003/0234414 A1 | 12/2003 | Brown |
| 2004/0000534 A1 | 1/2004 | Lipinski |
| 2004/0002203 A1 | 1/2004 | Deshpande et al. |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0070007 A1 | 4/2004 | Zhang |
| 2004/0079456 A1 | 4/2004 | Mandigo et al. |
| 2004/0079988 A1 | 4/2004 | Harari |
| 2004/0094786 A1 | 5/2004 | Tran et al. |
| 2004/0105330 A1 | 6/2004 | Juengling |
| 2004/0106257 A1 | 6/2004 | Okamura et al. |
| 2004/0150111 A1 | 8/2004 | Shimazu et al. |
| 2004/0195613 A1 | 10/2004 | Kweon |
| 2004/0197989 A1 | 10/2004 | Sommer et al. |
| 2004/0217391 A1 | 11/2004 | Forbes |
| 2004/0235255 A1 | 11/2004 | Tanaka |
| 2005/0001232 A1 | 1/2005 | Bhattacharyya |
| 2005/0017156 A1 | 1/2005 | Ehrmann et al. |
| 2005/0037584 A1 | 2/2005 | Abbott |
| 2005/0045965 A1 | 3/2005 | Lin et al. |
| 2005/0046048 A1 | 3/2005 | Yun et al. |
| 2005/0048714 A1 | 3/2005 | Noble |
| 2005/0059242 A1 | 3/2005 | Cabral et al. |
| 2005/0074949 A1 | 4/2005 | Jung et al. |
| 2005/0079721 A1 | 4/2005 | Buerger et al. |
| 2005/0145913 A1 | 7/2005 | Katsumata et al. |
| 2005/0148136 A1 | 7/2005 | Brask et al. |
| 2005/0156208 A1 | 7/2005 | Lin et al. |
| 2005/0164454 A1 | 7/2005 | Leslie |
| 2005/0184348 A1 | 8/2005 | Youn et al. |
| 2005/0186705 A1 | 8/2005 | Jackson et al. |
| 2005/0207264 A1 | 9/2005 | Hsieh et al. |
| 2005/0272259 A1 | 12/2005 | Hong |
| 2005/0277249 A1 | 12/2005 | Juengling |
| 2006/0011996 A1 | 1/2006 | Wu et al. |
| 2006/0017088 A1 | 1/2006 | Abbott |
| 2006/0019488 A1 | 1/2006 | Liaw |
| 2006/0028859 A1 | 2/2006 | Forbes |
| 2006/0033678 A1 | 2/2006 | Lubomirsky et al. |
| 2006/0043449 A1 | 3/2006 | Tang et al. |
| 2006/0043473 A1 | 3/2006 | Eppich |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046422 A1 | 3/2006 | Tran et al. |
| 2006/0046484 A1 | 3/2006 | Abatchev et al. |
| 2006/0073613 A1 | 4/2006 | Aggarwal et al. |
| 2006/0076090 A1 | 4/2006 | Mandigo et al. |
| 2006/0083996 A1 | 4/2006 | Kim |
| 2006/0094180 A1 | 5/2006 | Doczy et al. |
| 2006/0099793 A1 | 5/2006 | Yang et al. |
| 2006/0157795 A1 | 7/2006 | Chen et al. |
| 2006/0172540 A1 | 8/2006 | Marks et al. |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0246217 A1 | 11/2006 | Weidman et al. |
| 2006/0250593 A1 | 11/2006 | Nishii |
| 2006/0252264 A1 | 11/2006 | Kimizuka et al. |
| 2006/0258084 A1 | 11/2006 | Tang et al. |
| 2006/0258109 A1 | 11/2006 | Juengling |
| 2006/0261393 A1 | 11/2006 | Tang et al. |
| 2006/0263699 A1 | 11/2006 | Abatchev et al. |
| 2006/0264043 A1 | 11/2006 | Stewart et al. |
| 2006/0267075 A1 | 11/2006 | Sandhu et al. |
| 2006/0273456 A1 | 12/2006 | Sant et al. |
| 2006/0278911 A1 | 12/2006 | Eppich |
| 2006/0281250 A1 | 12/2006 | Schloesser |
| 2006/0281266 A1 | 12/2006 | Wells |

| | | | |
|---|---|---|---|
| 2006/0289919 | A1 | 12/2006 | Juengling |
| 2007/0018206 | A1 | 1/2007 | Forbes |
| 2007/0018223 | A1 | 1/2007 | Abbott |
| 2007/0026672 | A1 | 2/2007 | Tang et al. |
| 2007/0045712 | A1 | 3/2007 | Haller et al. |
| 2007/0048674 | A1 | 3/2007 | Wells |
| 2007/0049011 | A1 | 3/2007 | Tran |
| 2007/0049030 | A1 | 3/2007 | Sandhu et al. |
| 2007/0049032 | A1 | 3/2007 | Abatchev et al. |
| 2007/0049035 | A1 | 3/2007 | Tran |
| 2007/0049040 | A1 | 3/2007 | Bai et al. |
| 2007/0050748 | A1 | 3/2007 | Juengling |
| 2007/0114576 | A1 | 5/2007 | Forbes |
| 2007/0138528 | A1 | 6/2007 | Haller |
| 2007/0145450 | A1 | 6/2007 | Wang et al. |
| 2007/0164319 | A1 | 7/2007 | Thomas |
| 2007/0215960 | A1 | 9/2007 | Zhu et al. |

FOREIGN PATENT DOCUMENTS

| | | |
|---|---|---|
| DE | 42 36 609 A1 | 5/1994 |
| DE | 44 08 764 A1 | 9/1994 |
| DE | 199 28 781 C1 | 7/2000 |
| EP | 0227303 | 7/1987 |
| EP | 0 491 408 | 6/1992 |
| EP | 1 061 592 | 6/2000 |
| EP | 1 202 335 A | 5/2002 |
| EP | 1 357 433 | 10/2003 |
| EP | 0 681 338 | 10/2004 |
| EP | 0 936 623 | 4/2005 |
| JP | 53-148389 | 12/1978 |
| JP | 60-167349 | 8/1985 |
| JP | 1-100948 | 4/1989 |
| JP | 2-219253 | 8/1990 |
| JP | 4-130630 | 5/1992 |
| JP | 4-162528 | 6/1992 |
| JP | 05343370 | 12/1993 |
| JP | H8-55908 | 2/1996 |
| JP | H8-55920 | 2/1996 |
| JP | 11 040777 | 2/1999 |
| WO | WO 01/01489 A1 | 1/2001 |
| WO | WO 02/099864 A1 | 12/2002 |
| WO | WO 2004/001799 A2 | 12/2003 |
| WO | WO 2004/003977 | 1/2004 |
| WO | WO 2004/032246 A | 4/2004 |
| WO | WO 2004/038807 A | 5/2004 |
| WO | WO 2004/073044 | 8/2004 |
| WO | WO 2005/010973 | 2/2005 |
| WO | WO 2005/034215 A1 | 4/2005 |
| WO | WO 2005/119741 A3 | 12/2005 |
| WO | WO 2006/026699 | 3/2006 |

OTHER PUBLICATIONS

Forbes, "DRAM Array with Surrounding Gate Access Transistors and Capacitors Over Global Bit Lines", Surroundingdisc4.doc, Sept. 14, 2004.
Lau et al., "High Aspect Ration Submicron Silicon Pillars Fabricated by Photoassisted Electrochemical Etching and Oxidation", Applied Physics Letters, vol. 67(13), pp. 1877-1879, Sep. 25, 1995.
Lau et al., "High Aspect Ration Submicron Silicon Pillars for Light Emission Studies and Photonic Band Gap Material Application", 1995/6 Research Journal, Microelectric Group, 3 pages, Jun. 1996.
Lutze et al., "Field Oxide Thinning in Poly Buffer LOCOS Isolation With jActive Area Spacings to 0.1um", Journal of Electrochemical Society, vol. 137, No. 6, pp. 1867-1870, Jun. 1990.
Mandelman et al., Challenges and Future Directions for the Scaling of Dynamic Random-Access Memory (DRAM), IBM J. Res. & Dev, vol. 46, No. 2/3, pp. 187-212. Mar./May 2002.
"Notes from IEDM, Part 3", http://www.thinfilmmfg.com/Noteworthy/Noteworthy01/IEDM12Dec01.htm, 2 pages, Dec. 12, 2001.
"Quantum Confinement Effects in a 3D FinFET Transistor", http://www.ise.com/appex/FinFET/FinFET.html, 5 pages, Jan. 15, 2003.
Seeger et al., "Fabrication of Ordered Arrays of Silicon Nanopillars", J.Phys. D: Appl Phys., vol. 32, pp. L129-L132, 1999.
Wolf et al., "Silicon Processing for the VLSI Era", vol. 1, Lattice Press, CA, USA, pp. 529-555, 1986.
Ahn, S.J. et al., "Examination And Improvement Of Reading Disturb Characteristics Of A Surrounded Gate STTM Memory Cell," 2003 Third IEEE Conference on Nanotechnology, IEEE-Nano 2003. Proceedings (Cat. No. 03TH8700), Piscataway, NJ, USA: IEEE, 2003, vol. 2, pp. 528-530.
Ahn, S.J. et al., "Highly Scalable and CMOS-Compatible STTM Cell Technology," IEEE International Electron Devices Meeting 2003, Piscataway, NJ, USA: IEEE, 2003, pp. 10.4.1-4.
Cho, Hyun-Jin et al., "A Novel Pillar DRAM Cell 4 Gbit and Beyond," Digest of Technical Papers Symposium on VLSI Technology, Jun. 9-11 1998, pp. 38-39.
Cho, Hyun-Jin et al., "High Performance Fully And Partially Depleted Poly-Si Surrounding Gate Transistors," 1999 Symposium on VLSI Technology, Digest of Technical Papers (IEEE Cat. No. 99CH36325), Tokyo, Japan, Japan Soc. Appl. Phys, 1999, pp. 31-32.
Date, C.K. et al., "Suppression Of The Floating-Body Effect Using SiGe Layers in Vertical Surrounding-Gate MOSFETs," IEEE Transactions on Electron Devices, vol. 48, No. 12, Dec. 2001, pp. 2684-2689.
De, Indranil et al., "Impact of Gate Workfunction On Device Performance At The 50 nm Technology Node," Solid-State Electronics, vol. 44, No. 6, Jun. 2000, pp. 1077-1080.
Denton, Jack P. et al., "Fully Depleted Dual-Gate Thin-Film SOI P-MOSFET's Fabricated in SOI Islands With An Isolated Buried Polysilicon Backgate," IEEE Electron Device Letters, vol. 17, No. 11, pp. 509-511, Nov. 1996.
Doyle, B. et al, "Tri-Gate Fully-Depleted CMOS Transistors: Fabrication, Design and Layout," 2003 Symposium on VLSI Technology, Digest of Technical Papers, Tokyo; Japan Soc. Applied Phys, 2003.
Doyle, B.S. et al., "High Performance Fully-Depleted Tri-Gate CMOS Transistors," IEEE Electron Device Letters, vol. 24, No. 4, Apr. 2003.
Endoh, T. et al., "The $1.44F^2$ Memory Cell Technology With The Stacked-Surrounding Gate Transistor (S-SGT) DRAM," Proceedings on 2000 $22^{nd}$ International Conference on Microelectronics, 2000, vol. 2, May 14-17, 2000, pp. 451-454.
Endoh, Tetsuo et al, "An Accurate Model Of Fully-Depleted Surrounding Gate Transistor (FD-SGT)," IEICE Transactions on Electronics, vol. E80-C, No. 7, Jul. 1997, pp. 905-910.
Endoh, Tetsuo et al., "A High Signal Swing Pass-Transistor Logic Using Surrounding Gate Transistor," 2000 International Conference on Simulation of Semiconductor Processes and Devices, 2000, SISPAD 2000, Sep. 6-8, 2000, pp. 273-275.
Endoh, Tetsuo et al., An Analytic Steady-State Current-Voltage Characteristic Of Short Channel Fully-Depleted Surrounding Gate Transistor (FD-SGT), IEICE Transactions on Electronics, vol. E80-C, No. 7, Jul. 1997, pp. 911-917.
Endoh, Tetsuo et al., "Analysis Of High Speed Operation For Multi-SGT," Transactions of the Institute of Electronics, Information and Communication Engineers C-I, vol. J80C-I, No. 8, Aug. 1997, pp. 382-383.
Endoh, Tetsuo et al., "Floating Channel Type SGT Flash Memory," Transactions of the Institute of Electronics, Information and Communication Engineers C-I, vol. J82C-I, No. 3, Mar. 1999, pp. 134-135.
Endoh, Tetsuo et al., "Novel Ultra High Density Flash Memory With A Stacked-Surrounding Gate Transistor (S-SGT) Structured Cell," International Electron Devices Meeting, Technical Digest, IEEE, 2001, pp. 2.3.1-4.
Endoh, Tetsuo et al., "Novel Ultra High Density Flash Memory With A Stacked-Surrounding Gate Transistor (S-SGT) Structured Cell," International Electron Devices Meeting, Technical Digest, IEEE, pp. 33-36.
Endoh, Tetsuo et al., "The $2.4F^2$ Memory Cell Technology with Stacked-Surrounding Gate Transistor (S-SGT) DRAM," Transactions of the Institute of Electronics, vol. 48, No. 8, Aug. 2001, pp. 1599-1603.

Endoh, Tetsuo et al., "The Analysis Of The Stacked-Surrounding Gate Transistor (S-SGT) DRAM For The High Speed And Low Voltage Operation," IEICE Transactions on Electronics, vol. E81-C, No. 9, Sep. 1998, pp. 1491-1498.

Endoh, Tetsuo et al., "The Stacked-SGT DRAM Using 3D-Building Memory Array Technology," Transactions of the Institute of Electronics, Information and Communication Engineers C-I, vol. J81C-I, No. 5, May 1998, pp. 288-289.

Goebel, B. et al., "Fully Depleted Surrounding Gate Transistor (SGT) for 70 nm DRAM and Beyond," IEEE, 4 pgs., 2002.

Hioki, Masakazu et al., "An Analysis Of Program And Erase Operation For FC-SGT Flash Memory Cells," 2000 International Conference on Simulation of Semiconductor Processes and Devices, 2000, SISPAD 2000, Sep. 6-8, 2000. pp. 116-118.

Huang, Xuejue et al., "Sub-50 nm P-Channel FinFET," IEEE Transactions on Electron Devices, vol. 48, No. 5, May 2001.

Iwai, Makoto et al., "Buried Gate Type SGT Flash Memory," Transactions of the Institute of Electronics, Information and Communication Engineers C, vol. J86-C, No. 5, May 2003, pp. 562-564, Journal Paper.

Kalavade, Pranav et al., "A Novel Sub-10nm Transistor," IEEE Device Research Conf., Denver, Co, pp. 71-72, Jun. 2000.

Kedzierski, Jakub et al., "High-Performance Symmetric-Gate And CMOS-Compatible Vt Asymmetric-Gate FinFET devices," IEDM, 2001, paper 19.5., 4 pgs.

Kim, Keunwoo et al., "Nanoscale CMOS Circuit Leakage Power Reduction by Double-Gate Device" International Symposium on Low Power Electronics and Design Newport Beach Marriott Hotel, Newport, California, Aug. 9-11, 2004, http://www.islped.org., pp. 102-107.

Kranti, A. et al., "Optimisation For Improved Short-Channel Performance Of Surrounding/Cylindrical Gate MOSFETs," Electronics Letter, vol. 37, Issue 8, Apr. 12, 2001, pp. 533-534.

Kranti, Abhinav, et al, "An Analytical Temperature Dependent Threshold Voltage Model For Thin Film Surrounded Gate SOI MOSFET," Proceedings of the SPIE—The International Society for Optical Engineering, vol. 3975, pt. 1-2, 2000, pp. 605-608.

Matsuoka, Fumiyoshi et al., "A Study Of Soft Error In SGT DRAM," Record of Electrical and Communication Engineering Conversazione Tohoku University, vol. 71, No. 1, Oct. 2002, pp. 469-470, Journal Paper.

Matsuoka, Fumiyoshi et al., "Numerical Analysis Of Alpha-Particle-Induced Soft Errors In Floating Channel Type Surrounding Gate Transistor (FC-SGT) DRAM cell," Electron Devices, IEEE Transactions on, vol. 50, Issue 7, Jul. 2003, pp. 1638-1644.

Miyamoto, Shoichi et al., "Effect of LDD Structure And Channel Poly-Si Thinning On A Gate-All-Around TFT (GAT) for SRAM's," IEEE Transactions on Electron Devices, vol. 46, No. 8, Aug. 1999, pp. 1693-1698.

Miyano, Shinji et al., "Numerical Analysis Of A Cylindrical Thin-Pillar Transistor (CYNTHIA)," IEEE Transactions on Electron Devices, vol. 39, No. 8, Aug. 1992, pp. 1876-1881.

Nakamura, T "A Study Of Steady-State Characteristics Of SGT Type Three-Dimensional MOS Transistor," Record of Electrical and Communication Engineering Conversazione Tohoku University, vol. 66, No. 1, Jan. 1998, pp. 211-212.

Nishi, Ryohsuke et al., "Analysis Of The Shape Of Diffusion Layer Of Sgt For Suppressing Substrate Bias Effect," Transactions of the Institute of Electronics, Information and Communication Engineers C, vol. J84-C, No. 10, Oct. 2001, pp. 1018-1020.

Nishi, Ryohsuki et al., "Concave Source SGT for Suppressing Punch-Through Effect," Transactions of the Institute of Electronics, Information and Communication Engineers C. vol. J86-C, No. 2, Feb. 2003, pp. 200-2001.

Nitayama, Akihiro et al., "High Speed And Compact CMOS Circuits With Multi-Pillar Surrounding Gate Transistors," IEEE Transactions on Electron Devices, vol. 36, No. 11, pt. 1, Nov. 1989, pp. 2605-2606.

Nitayama, Akihiro, et al. "Multi-Pillar Surrounding Gate Transistor (M-SGT) For Compact And High-Speed Circuits," IEEE Transactions on Electron Devices, vol. 38, Issue 3, Mar. 1991, pp. 579-583.

Sakai, Takeshi et al., "A Study Of Stacked-SGT-Based Pass-Transistor Logic Circuit," Record of Electrical and Communication Engineering Conversazione Tohoku University, vol. 72, No. 2, Feb. 2004, pp. 108-109.

Sakamoto, Wataru et al., "A Study Of Current Drivability Of SGT," Record of Electrical and Communication Engineering Conversazione Tohoku University, vol. 72, No. 2, Feb. 2004, pp. 110-111.

Sunouchi, K. et al., "A Surrounding Gate Transistor (SGT) Cell for 64/256 Mbit DRAMs," International Electron Devices Meeting 1989, Technical Digest (Cat. No. 89CH2637-7), New York, NY, USA: IEEE, 1989, pp. 23-26.

Suzuki, Masahiko, "The 2.4F2 Memory Cell Technology with Stacked-Surrounding Gate Transistor (S-SGT) DRAM", Transactions of the Institute of Electronics C, vol. J83-C, No. 1, Jan. 2000, pp. 92-93.

Takato, H. et al. "High Performance CMOS Surrounding Gate Transistor (SGT) For Ultra High Density LSIs," IEEE Electron Devices Meeting, Technical Digest, pp. 222-225, 1998.

Takato, Hiroshi et al., "Impact Of Surrounding Gate Transistor (SGT) for Ultra-High Density LSI's," IEEE Transactions on Electron Devices, vol. 38, Issue 3, Mar. 1991, pp. 573-578.

Terauchi, M. et al., "A Surrounding Gate Transistor (SGT) Gain Cell For Ultra High Density DRAMs," 1993 Symposium on VLSI Technology, Digest of Technical Papers (IEEE Cat. No. 93CH 3303-5) Tokyo, Japan: Bus. Center for Acad. Soc. Japan, 1993, pp. 21-22.

Terauchi, Mamoru et al., "Depletion Isolation Effect Of Surrounding Gate Transistors," IEEE Transactions on, vol. 44, Issue 12, Dec. 1997, pp. 2303-2305.

Watanabe, Shigeyoshi et al., "A Novel Circuit Technology With Surrounding Gate Transistors (SGT's) For Ultra High Density DRAM's," IEEE Journal of Solid-State Circuits, vol. 30, No. 9, Sep. 1995, pp. 960-971.

Watanabe, Shigeyoshi, "Impact Of Three-Dimensional Transistor On The Pattern Area Reduction For ULSI," IEEE Transaction on Electron Devices, vol. 50, No. 10, Oct. 2003, pp. 2073-2080.

Wong, Hon-Sum P. et al., "Self-Aligned (Top and Bottom) Double-Gate MOSFET with a 25nm Thick Silicon Channel," IEEE Int. Electron Device Meeting, 1997, pp. 427-430.

Xuan, P. et al., "60nm Planarized Ultra-Thin Body Solid Phase Epitaxy MOSFETs," IEEE Device Research Conf., Denver, CO, pp. 67-68, Jun. 2000.

Yamashita, Hiroomi et al., "A Study Of Process Design In Three Dimensional SGT Device," Record of Electrical and Communication Engineering Conversazione Tohoku University, vol. 71, No. 1, Oct. 2002, pp. 467-468.

Zhang, Wei et al., "A Study Of Load Capacitance In SGT," Record of Electrical and Communication Engineering Conversazione Tohoku University, vol. 71, No. 1, Oct. 2002, pp. 473-474.

U.S. Appl. No. 11/457,423, filed Jul. 13, 2006, Leonard Forbes, Dec. 18, 2008 Notice of Allowance, May 20, 2008 Non-Final Office Action.

U.S. Appl. No. 11/462,617, filed Aug. 4, 2006, Leonard Forbes, Nov. 30, 2008 Notice of Allowance, Jun. 5, 2008 Non-Final Office Action.

Barth, Roger, "Itrs commodity memory roadmap" Memory Technology, Design and Testing, 2003. Records of the 2003 International Workshop on Jul. 28-29, 2003, Piscataway, NJ, USA, IEEE, Jul. 28, 2003, pp. 61-63.

Bergeron, D., "Resolution Enhancement Techniques for the 90nm Technology Node and Beyond, " Future Fab International, Issue 15, Jul. 11, 2003, 4 pages.

Bhave, et al., "Developer-soluable Gap fill materials for patterning metal trenches in Via-first Dual Damascene process," preprint of Proceedings of SPIE: Advances in Resis Technology and Processing XXI, vol. 5376, John L. Sturtevant, editor, 2004, 8 pages, Feb. 2004.

Chen I. C. et al.,"A Trench Isolation Study for Deep Submicron CMOS Technology" VLSI Technology, Systems, and Applications, 1993. Proceedings of Technical Papers. 1993 International Symposium on Taipei, Taiwan May 12-14, 1993, New York, NY, USA, IEEE, US, May 12, 1993, pp. 251-255, XP010068040 ISBN: 0-7803-0978-2.

Cho et al., "A novel pillar DRAM cell for 4Gbit and beyond," *IEEE*, 1998, pp. 38-39.

Choi Y-K et al, "Nanoscale CMOS Spacer FinFET for the Terabit Era" IEEE Electron Device Letters, IEEE Inc. New York, US, vol. 23; Jan. 2002; pp. 25-27.

Choi et al., "Sublithographic nanofabrication technology for nanocatalysts and DNA chips," J. Vac. Sci. Techno.l, Nov/Dec 2003; pp. 2951-2955.

Cristoloveanu S: "Introduction to Silicon On Insulator Materials and Devices" Microelectronic Engineering, Elsevier Publishers BV., Amsterdam, NL, vol. 39, No. 1-4, Dec. 1, 1997, pp. 145-154, XP004099506 ISSN: 0167-9317 p. 147, paragraph 3, p. 149, paragraph 3.

Chung, K., "Pattern multiplication method and the uniformity of the nanoscale multiple lines", J. Vac. Sci. Technol. B21(4), Jul./Aug. 2003, pp. 1491-1495.

Chung, K., "Nanoscale Multi-Line Patterning Using Sidewall Structure," Jpn., J.App. Phys. vol. 41 (2002) Pt. 1, No. 6B, pp. 4410-4414.

Doyle, B., et al., "Tri-Gate fully-depleted CMOS transistors: fabrication, design and layout," 2003 *Symposium on VLSI Technology*. Digest of Technical Papers, Tokyo; Japan Soc. Applied Phys, 2003, pp. 133-134.

Endoh et al., "Novel ultrahigh-density flash memory with a stacked-surrounding gate transistor (S-SGT) structured cell," *IEEE Transactions on Electron Devices*, Apr. 2003, pp. 945-951, vol. 50, No. 4.

Gili, Enrico, "Fabrication of Vertical Mos Transistors at Southampton University", Progress Report, University of Southampton, Facitlity of Engineering and Applied Sciences, Department of Electronics and Computer Science Microelectronics Group, Jul. 2003.

Goebel, et al. "Fully Depleted Surrounding Gate Transistor (SGT) for 70nm DRAM and beyond," Electron Devices Meeting, 2002. IEDM '02 Digest. International, Dec. 8-11, 2002, pp. 275-278.

Hisamoto D. et al., "FinFET-A Self-Aligned Double-Gate Mosfet Scaleable to 20 NM" IEEE Transactions on Electron Devices, IEEE Inc. New York, US, vol. 47, No. 12, Dec. 2000 pp. 2320-2325, XP000977037 ISSN: 0018-9383 p. 2324, paragraph 3.

Imai K et al: "Crystalline Quality of Silicon Layer Formed by Fipos Technology" Journal of Crystal Growth, North-Holland Publishing Co. Amsterdam, NL, vol. 63, 1983, pp. 547-553, XP000602040 ISSN: 0022-0248.

Joubert, O., "Nanometer scale linewidth control during etching of polysilicon gates in high-density plasmas," Microelectric Engineering 69 (2003), pp. 350-357.

Kal S., "Isolation Technology in Monolithic Integrated Circuits: an overview" IETE Technical Review India, vol. 11, No. 2-3, Mar. 1994, pp. 91-103, XP001247916 ISSN: 0256-4602.

Lim, et al., "Atomic Layer Deposition of Transition Metals", Nature vol. 2, Nov. 2003, pp. 749-753.

Nitayama, Akihiro, et al. "Multi-Pillar Surrounding Gate Transistor (M-SGT) For Compact And High-Speed Circuits," IEEE Transactions on Electron Devices, vol. 38, Issue 3, Mar. 1991, pp. 573-578.

Oehrlein, G., "Pattern Transfer Into Low Dielectric Materials By High-Density Plasma Etching," Solid State Tech., May 2000, 8 pages.

Peters, L., "Choices and Challenges for Shallow Trench Isolation", Apr. 1, 1999, *Semiconductor International*, www.reed-electronics.com/semiconductor.

Peters, L., "Emerging Transistor Structures", Mar. 1, 2002, *Semiconductor International*, www.reed-electronics.com/semiconductor.

Pohm, et al, "Experimental and analytical properties of 0.2 micron wide, multi-layer, GMR, memory elements," Transactions on Magnetics, Sep. 1996, pp. 5645-4647, vol. 32, No. 5.

Pohm, et al., "Experimental and analytical properties of 0.2-um-wide, end-on, multilayer giant magnetoresistance, read head sensors," Journal of Applied Physics, vol. 79, Issue 8, Apr. 1996, pp. 5889-5891.

Sakao, M., et al., A Straight-Line-Trench Isolation and Trench-Gate Transister (SLIT) Cell for Giga-bit DRAMs; IEEE VLSI Technology Symposium May 17-19, 1993 Kyoto, Japan, pp. 19-20.

Schloesser et al., "Highly Scalable Sub-50nm Vertical Gate Trenh Dram Cell", Memory Development Center, Infineon Tech., 2004, 4 pages.

Sunouchi et al., "A surrounding gate transistor (SGT) cell for 64/256 Mbit DRAMs," *IEEE*, ULSI Research Center, Toshiba Corporation, Japan, 1989, pp. 2.1.1-2.1.4.

Takato et al., "High performance CMOS surrounding gate transistor (SGT) for ultra high density LSIs," *IEEE*, 1988, 4 pages.

Takeda, Eiji et al. "A New Soi Device-Delta-Structure and Characteristics" IEICE Transactions, Institute of Electronics Information and Comm. Eng. Tokyo, JP, vol. E74, No. 2, Feb. 1, 1991, pp. 360-368, XP000230407 ISSN: 0917-1673, p. 361, paragraph 7-8.

Wong et al., "Self-aligned (top and bottom) double-gate MOSFET with a 25 nm thick silicon channel," IBM T.J. Watson Research Center, 4 pages, IEEE, 1997, pp. 427 -430.

Yan, Ran-Hong, et al., "Scaling the Si MOSFET: From Bulk to SOI to Bulk" IEEE Transactions on Electron Devices, vol. 39 No. 7 Jul. 1992, pp. 1704-1710.

U.S. Appl. No. 11/457,423, filed Jul. 13, 2006, Leonard Forbes.

U.S. Appl. No. 11/462,617, filed Aug. 4, 2006, Leonard Forbes, Jun. 5, 2008 Non-Final Office Action.

SURROUND GATE ACCESS TRANSISTORS WITH GROWN ULTRA-THIN BODIES

RELATED APPLICATIONS

This application is a divisional of U.S. application Ser. No. 11/175,677, filed Jul. 6, 2005, entitled SURROUND GATE ACCESS TRANSISTORS WITH GROWN ULTRA-THIN BODIES which is hereby incorporated in its entirety by reference herein.

BACKGROUND OF THE INVENTION

1. Field of the Invention

The invention relates to the field of semiconductor memory arrays and, more particularly, to arrays with access transistors having grown ultra-thin bodies.

2. Description of the Related Art

Ongoing scaling of metal oxide semiconductor field effect transistor (MOSFET) technology to the deep sub-micron region where channel lengths are less than 0.1 micron (100 nanometers or 1,000 Å) causes significant problems in conventional transistor structures. Generally, junction depth should be much less than the channel length, and thus for a channel length of, for example 1,000 Å, this implies junction depths on the order of a few hundred Angstroms. Such shallow junctions are difficult to form by conventional implantation and diffusion techniques.

FIG. 1 illustrates general trends and relationships for a variety of device parameters with scaling by a factor k. As another example, with an aggressive scaling factor, extremely high levels of channel doping are required to suppress undesirable short channel effects, such as drain induced barrier lowering (DIBL), threshold voltage roll off, and sub-threshold conduction. Sub-threshold conduction is particularly problematic in dynamic random access memory (DRAM), as it significantly reduces the charge storage retention time of the capacitor cells. Extremely high doping level generally results in increased leakage and reduced carrier mobility. Thus making the channel shorter to improve performance is offset or negated by the lower carrier mobility and higher leakage. This leakage current is a significant concern and problem in low voltage and low power battery operated complimentary metal oxide semiconductor (CMOS) circuits and systems, particularly in DRAMs.

FIG. 2 shows that if low voltages are used for this low power operation, there is a problem with threshold voltages and standby leakage current being of large enough value to degrade overall circuit performance. For example, to achieve significant overdrive and reasonable system switching speeds, the threshold voltage magnitudes are desirably small, in this example near 0 volts. However the transistor, such as an access transistor, will always have a large sub-threshold leakage current. Various technologies have been employed to allow low voltage operation with deep sub-micron CMOS transistors that can have relatively large variations in threshold voltage, yet still have relatively low sub-threshold leakage currents at standby.

For example, one technique used in scaling down transistors is referred to as dual-gated or double-gated transistor structures. The terminology generally employed in the industry is "dual-gate" if the transistor has a front gate and a back gate which can be driven with separate and independent voltages and "double-gated" to describe structures where both gates are driven with the same potential. In certain aspects, a dual-gated and/or double-gated MOSFET offers better device characteristics than conventional bulk silicon MOSFETs. Because a gate electrode is present on both sides of the channel, rather than only on one side as in conventional planar MOSFETs, the electrical field generated by the drain electrode is better screened from the source end of the channel than in conventional planar MOSFETs, as illustrated schematically by the field lines in FIG. 3.

This can result in an improved sub-threshold leakage current characteristic, as illustrated schematically in FIG. 4. The dual-gate and/or double-gate MOSFET turns off and the sub-threshold current is reduced more quickly as the gate voltage is reduced. However, even though dual gate and/or double gate structures offer advantages over conventional bulk silicon MOSFETs, there remains a desire for continued improvement in device performance with continued aggressive scaling. More particularly, there is a need to provide very thin transistor bodies that can control short channel effects with reduced need for extremely high doping levels to avoid the aforementioned difficulties. There is also a need for devices that can be more easily and reliably fabricated.

SUMMARY OF THE INVENTION

The aforementioned needs are satisfied by the invention which in one embodiment comprises a transistor comprising a vertical annular semiconductive transistor body, a surround gate structure formed around the annular transistor body, a source region formed adjacent a lower portion of the body, and a drain region formed adjacent an upper portion of the body such that the transistor defines a field effect transistor.

Another embodiment comprises An access array for memory cells comprising a semiconductive substrate, a plurality of first conductors formed in a first direction along a surface of the substrate, a plurality of transistors formed on the surface of the substrate so as to be offset from associated first conductors and at least partially connected to the associated first conductors, and a plurality of second conductors formed in a second direction and electrically connected with associated transistors such that the transistors can be turned on and off by application of appropriate potentials to the second conductors.

Yet another embodiment comprises a method of forming transistor structures comprising forming a pillar vertically extending from a surface of a substrate, growing a single crystalline semiconductive transistor body to extend vertically around the pillar, forming a surround gate structure around the transistor body, forming a source region adjacent lower portions of the transistor body, and forming a drain region adjacent an upper portion of the transistor body.

Thus, various embodiments provide an annular, vertical transistor body having ultra-thin dimensions. The transistor body can be grown which avoids difficulties in sub-lithographic etching based process. The transistors can also be offset from alignment with buried data/bit lines which provides a continuous conductive path extending alongside source regions of the transistors. The continuous conductive path provides improved conductive characteristics for the data/bit lines, particularly over extended distances. These and other objects and advantages of the invention will be more apparent from the following description taken in conjunction with the accompanying drawings.

DETAILED DESCRIPTION OF THE PREFERRED EMBODIMENT

Figure 1:
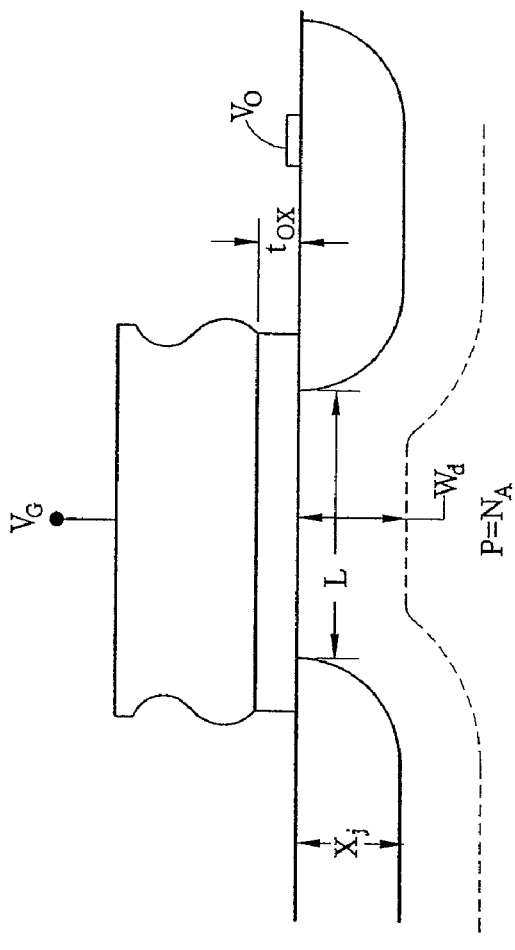
FIG. 1 is schematic illustration of general relationships of various device parameters/characteristics for a scaling factor k.
Figure 2:
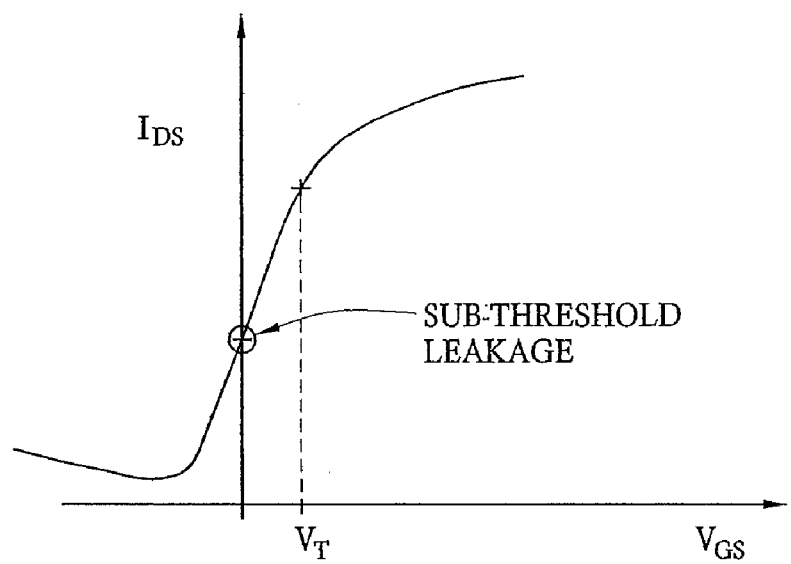
FIG. 2 is a graph illustrating sub-threshold leakage in a conventional silicon MOSFET.
Figure 3:
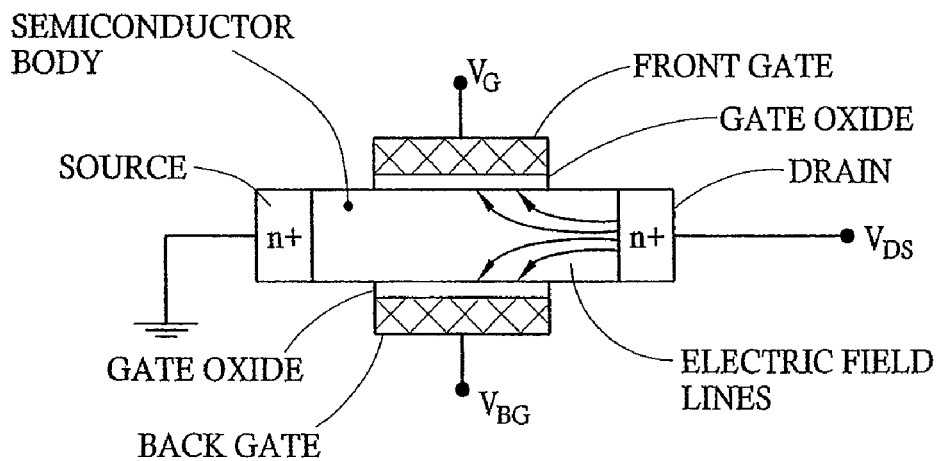
FIG. 3 is a schematic illustration of a known dual-gate MOSFET.
Figure 4:
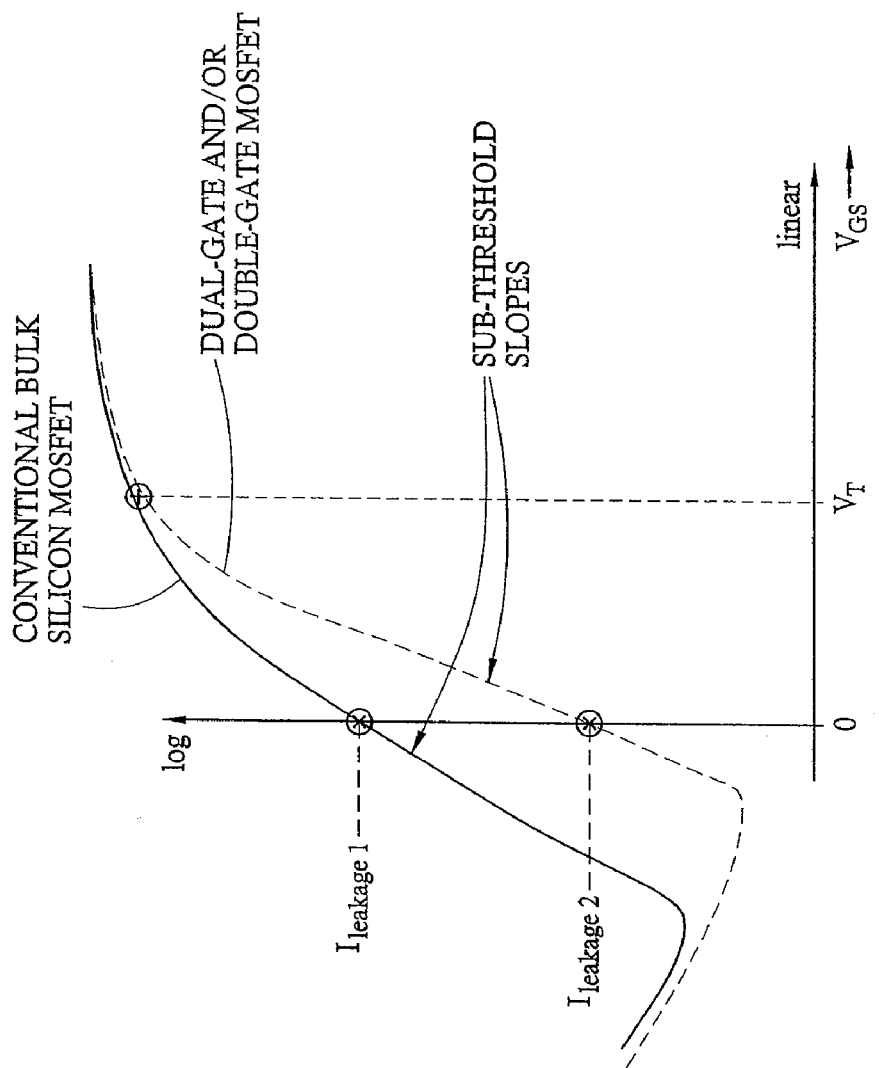
FIG. 4 is a graph illustrating sub-threshold conduction characteristics of conventional bulk silicon MOSFETs and of dual-gate and/or double gate MOSFETs.
Figure 5:
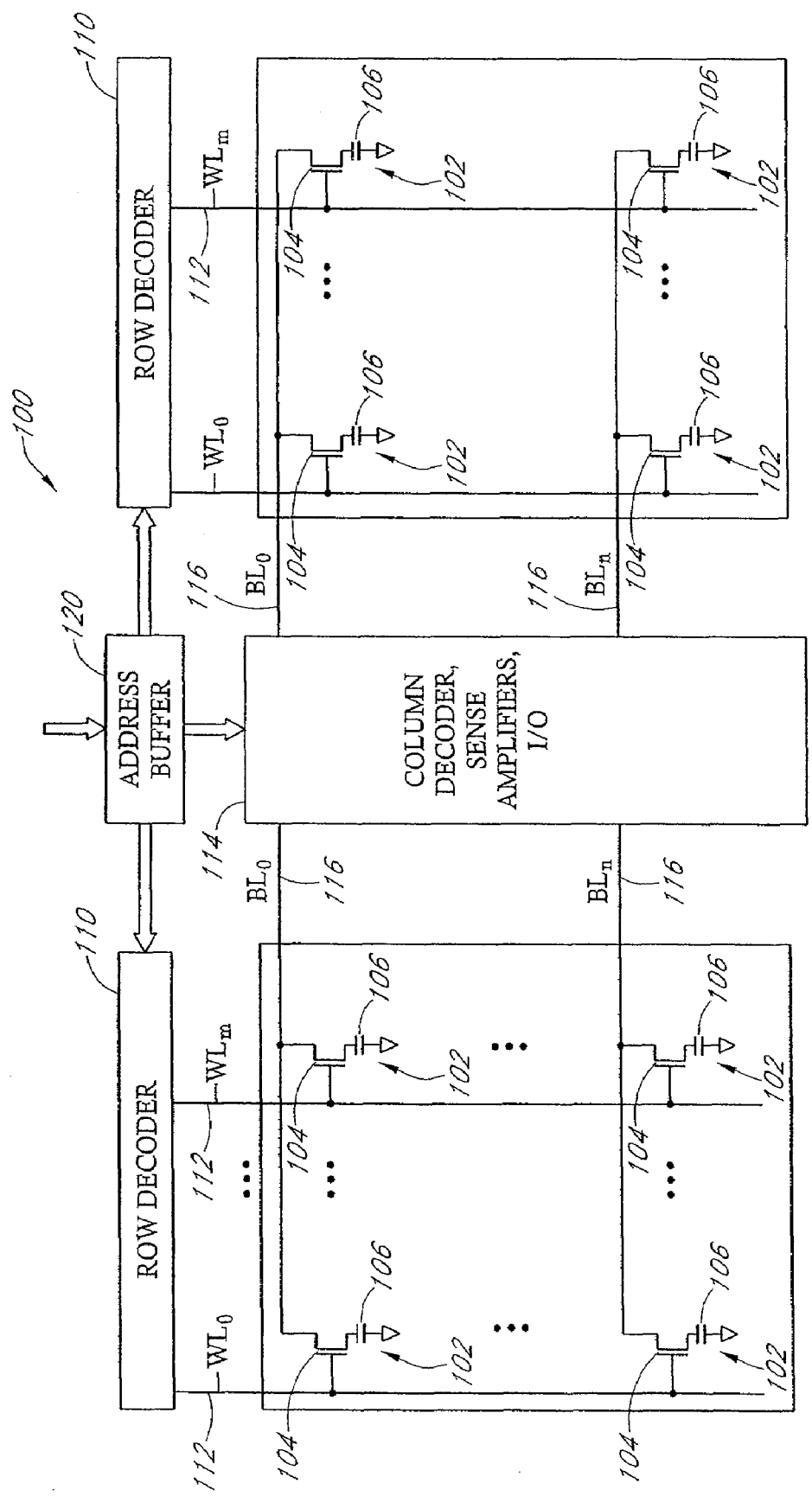
FIG. 5 is a circuit schematic illustration of one embodiment of a memory array.

Description of various embodiments of the invention will now be described with respect to the drawings wherein like reference designators refer to like structures, elements, and/or processes throughout. It should be understood that the illustrations are schematic in nature and should not be interpreted as being to scale. FIG. 5 is a schematic circuit diagram of one embodiment of a memory array 100. The memory array 100 is configured for storage and retrieval of digital data in a plurality of memory cells 102 comprising the array 100. In this embodiment, each memory cell 102 comprises an access transistor 104 connected to a charge storage device 106. In one embodiment, the charge storage device 106 comprises a stacked storage capacitor which will be described in greater detail below. The charged storage devices 106 store the digital data wherein presence of a predetermined quantity of charge on a charge storage device 106 corresponds to a first data state and wherein absence of the predetermined charge corresponds to a second data state. The access transistors 104 are connected to corresponding charge storage devices 106. This provides a selectable electrically conductive path to the charge storage device 106 to provide a path to the charge storage devices 106 for write operations, as well as to evaluate the quantity of charge stored on the charge storage devices 106 in read operations.

The array 100 also comprises one or more row decoder modules 110 which are connected to a plurality of word lines 112. Each word line 112 is connected to a corresponding plurality of access transistors 104. The word lines 112 with corresponding access transistors 104 are arranged in parallel in what is generally referred to as columns. The word lines 112 conduct electrical signals which turn on or turn off the corresponding column of access transistors 104 for read and write operations to the corresponding memory cells 102.

The array 100 also comprises one or more column decoder modules 114 which comprise a plurality of sense amplifiers.

The one or more column decoders 114 are connected to a plurality of data/bit lines 116. The data/bit lines 116 are also connected to a plurality of access transistors 104. The data/bit lines 116 with the associated access transistors 104 are arranged in parallel in what is generally referred to as a row configuration. Thus, the word lines 112 and data/bit lines 116 are arranged in intersecting directions and, in one particular embodiment, are arranged so as to define a generally rectangular array of the memory cells 102. The data/bit lines 116 also conduct signals to the one or more column decoder modules 114 wherein the signals are indicative of the quantity of charge stored on the associated charge storage devices 106. Similarly, the data/bit lines 116 can be utilized to provide the predetermined charge quantity to a charge storage device 106 or to drain the charge from the charge storage device 106 to affect write operations. Thus, activation of a selected word line 112 and a data bit line 116 provides access to the memory cell 102 at the intersection of these selected word line 112 and data/bit line 116.

The one or more row decoder modules 110 and one or more column decoder modules 114 are also connected to an address buffer 120. The address buffer 120 can provide electrical signals corresponding to particular data states to the individual memory cells 102 of the array 100 via the row decoder modules 110 and column decoder modules 114 for write operations. Similarly, the address buffer 120 can receive signals corresponding to the stored data state of the individual memory cells 102 again via the row decoders 110 and column decoders 114 in rad operations. The address buffer 120 is configured for interface with one or more other systems in manners well understood by those of ordinary skill.

Figure 6:
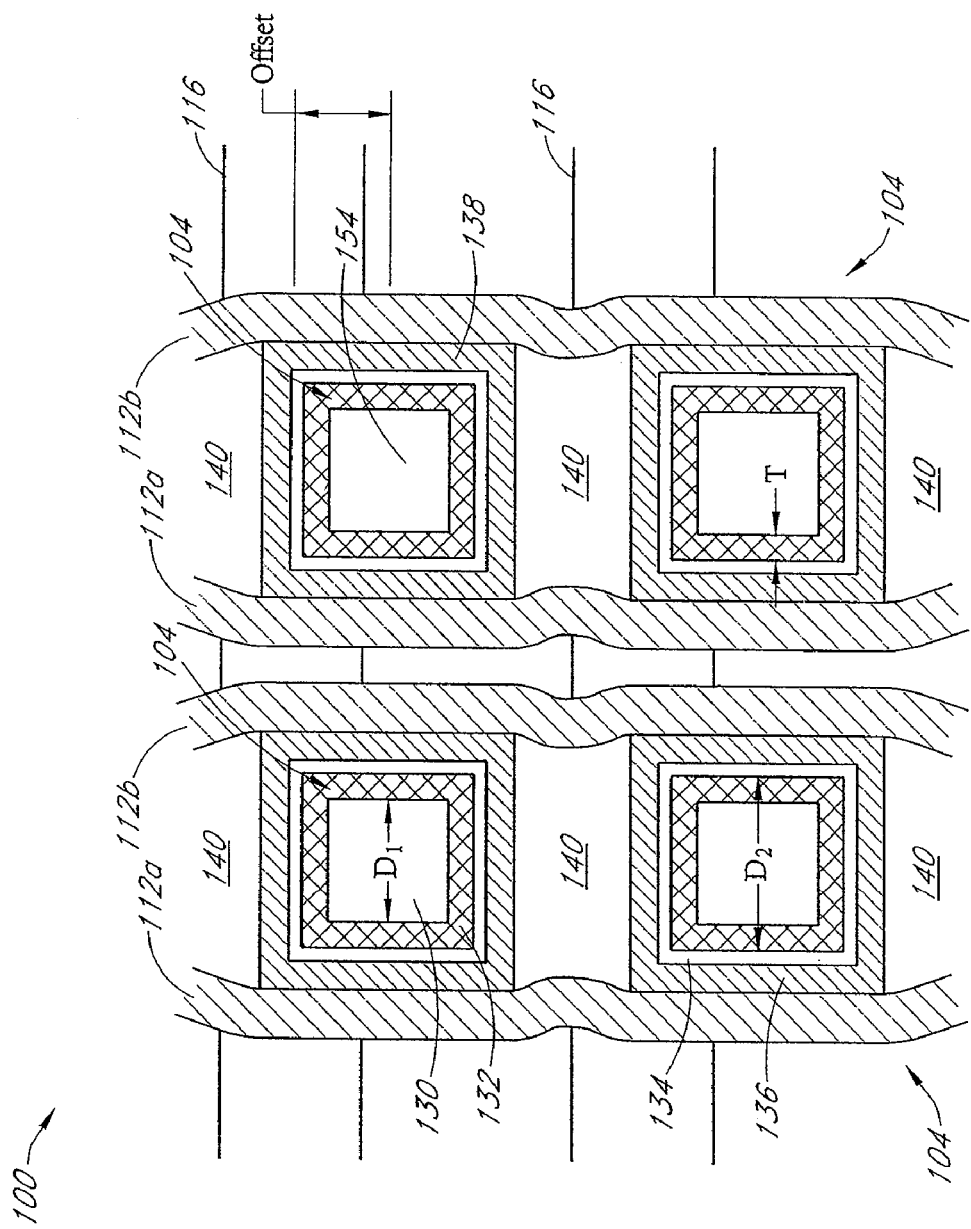
FIG. 6 is a top view of one embodiment of a memory access array with access transistors having grown ultra-thin bodies.

FIG. 6 illustrates schematically in a top view one embodiment of access transistors 104 of an array 100. In this embodiment, the access transistors 104 comprise a vertically extending central pillar 130 (see also FIGS. 7, 8b, and 8c). The central pillar 130 extends upward from an upper surface of a semi-conductive substrate 150. In one particular embodiment, the central pillar 130 has a generally rectangular or square cross-section. However in other embodiments the pillar 130 describes a generally circular or oval cross-section, a triangular cross-section, or other shape appropriate to the requirements of particular applications.

In this embodiment, the access transistors 104 also comprise an annular transistor body 132 which substantially surrounds or encompasses the central pillar 130 along the vertical sides and top of the pillar 130. In one embodiment, the annular transistor body 132 comprises silicon which is doped to approximately $5 \times 10^{17}/cm^2$ with boron. The annular transistor body 132 provides an active transistor region for a field affect transistor structure which will be described in greater detail below.

In one particular embodiment, the central pillar 130 has a lateral or horizontal dimension $D_1$ of approximately 80 nm or 0.08 μm. The annular transistor body 132 has an outer lateral or horizontal dimension $D_2$ of approximately 100 nm or having an ultra-thin wall thickness T of approximately 20 nm. Thus, the annular transistor body 132 describes a generally vertical hollow annular structure having a wall thickness of approximately 20 nm. In one embodiment, the annular transistor body 132 also has a height H of approximately 100 nm.

The access transistors 104 also comprise a gate dielectric 134 surrounding the annular transistor body 132. The gate dielectric 134 describes a generally annular vertically extending structure in contact with the body 132. The gate dielectric 134 has similar cross-section to the annular transistor body 132. The access transistors 104 also comprise a gate conductor 136 which surrounds or encompasses the gate dielectric 134. In one embodiment, the gate conductor 136 comprises conductive doped polycrystalline silicon (polysilicon). The gate conductor 136 is connected at opposed vertical or faces S1 and S2 to corresponding word lines 112. In one particular embodiment, each word line 112 comprises a separate first word line 112a and a second word line 112b. In certain embodiments, the word lines 112a and 112b are driven at the same voltage to apply or remove potential from the corresponding gate conductors 136 in concert. In other embodiments, the word lines 112a and 112b can be independently driven.

A dielectric layer or region 140 is positioned between adjacent individual access transistors 104 to electrically isolate each access transistor 104 from adjacent neighboring access transistors 104. In certain embodiments, the gate dielectric structures 134 and dielectric layers 140 comprise a single materially continuous layer or region and in other embodiments, the gate dielectric structures 134 and dielectric layer or regions 140 comprise separate structures.

Figure 7:
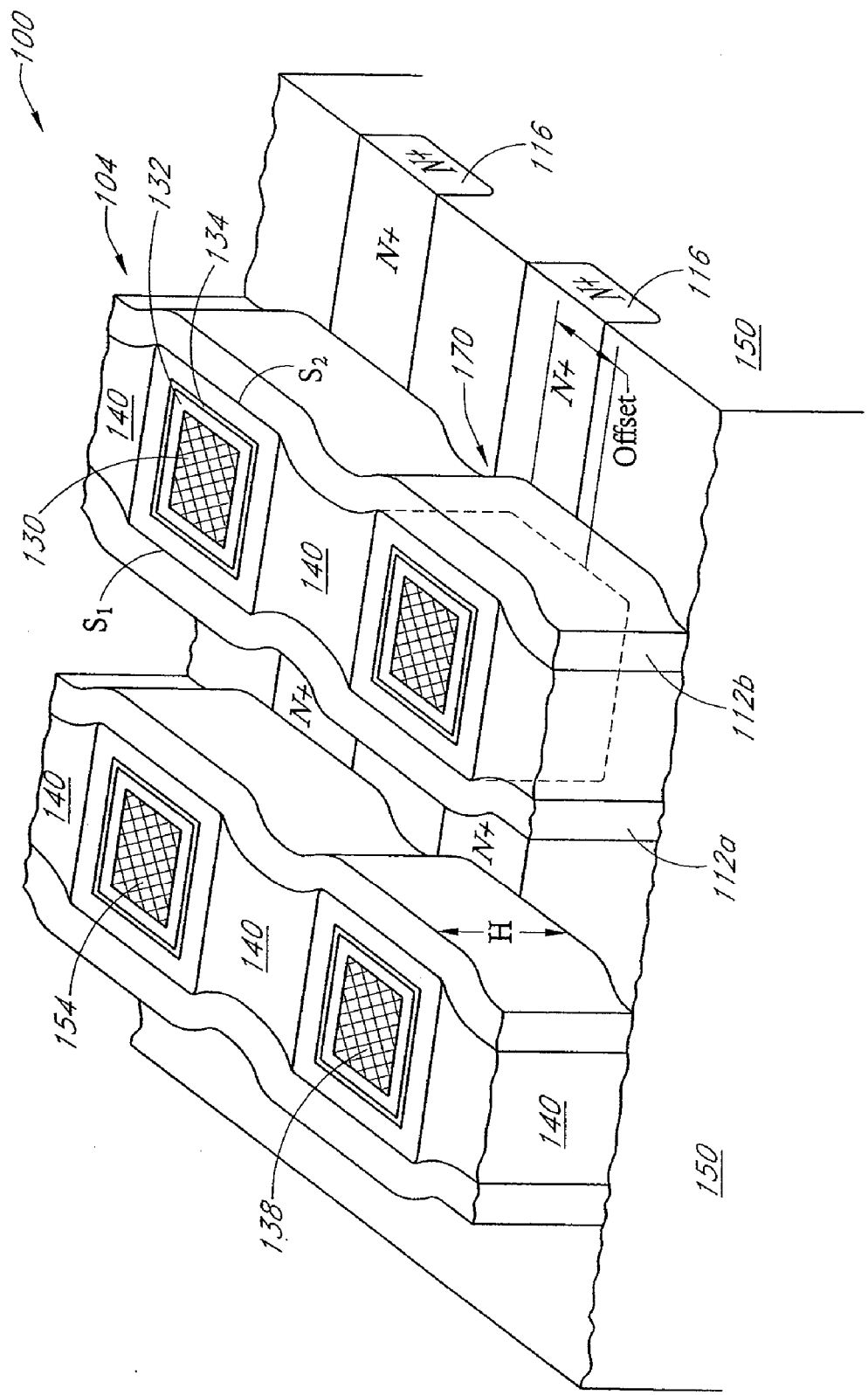
FIG. 7 is a perspective view of one embodiment of a memory access array with access transistors having grown ultra-thin bodies.
Figure 8A:
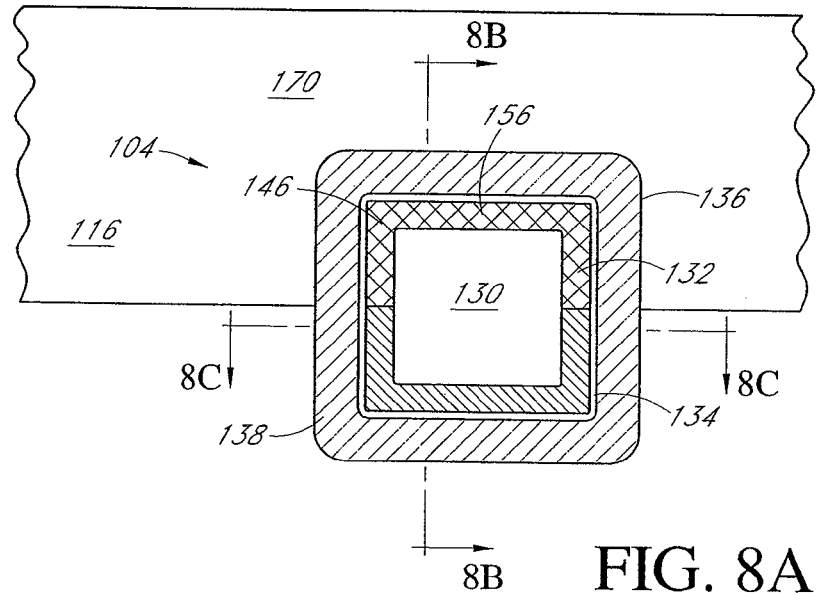
FIGS. 8A, 8B, and 8C are top, front section, and rear section views respectively of one embodiment of an access transistor with a grown ultra-thin body.
Figure 8B:
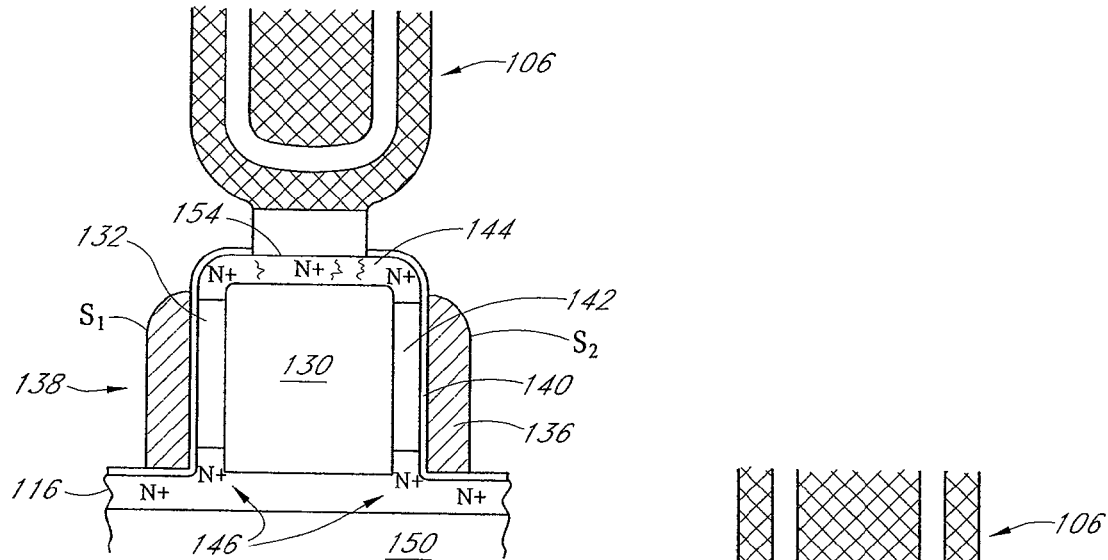
Figure 8C:
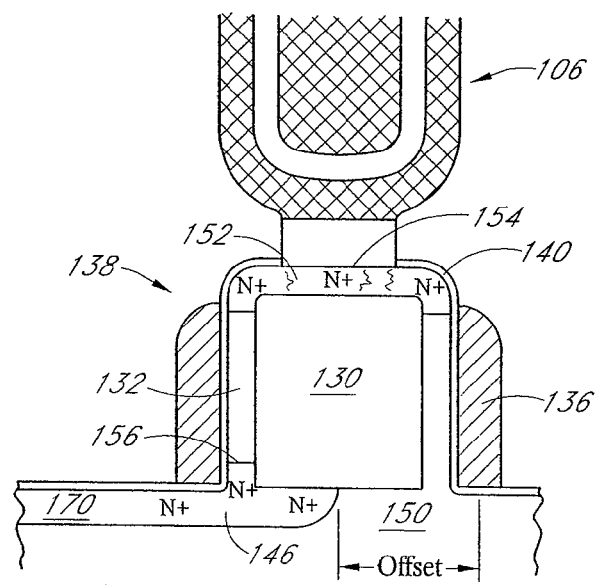

As can also be seen in FIGS. 6, 7, and 8C, in one embodiment the access transistors 104 are offset from overlying centered alignment with the data/bit lines 116. In one particular embodiment, the access transistors 104 are offset laterally by a distance of approximately half the width of the access transistor 104 along the directions of the word lines 112 such that approximately half of the access transistor 104 overlies the corresponding data/bit line 116 with the remaining half extending beyond the edge or boundary of the corresponding data/bit line 116. This provides a region of the data/bit line 116 substantially isolated from the transistor action of the access transistors 104 to improve the conduction characteristics of the data/bit lines 116 as will be described in greater detail below.

FIGS. 8A, 8B, and 8C illustrate top, front, and side section views respectively of one embodiment of access transistor 104 in greater detail. As shown in FIG. 8B, the annular transistor body 132, in this embodiment, encompasses or surrounds the central pillar 130 along vertical sides thereof as well as along an upper surface thereof. In this embodiment, the annular transistor body 132 comprises a single crystalline body region 142 extending upwards from the upper surface of the substrate 150 along the sides or vertical surfaces of the central pillar 130. In one embodiment described in greater detail below, the single crystalline body region 142 comprises a grown region of silicon which is grown along the sides of the vertically extending central pillar 130.

The annular transistor body 132 also comprises a multiple grain region 144 positioned generally at the top or upper regions of the transistor body 132. The multiple grain region 144 comprises a region of the transistor body 132 wherein multiple silicon crystalline structures merge to define a plurality of grain boundaries of a polycrystalline silicon region. Formation of a conduction channel for the transistors 104 occurs substantially in the single crystalline body region 142 rather than in the multiple grain region 144. Thus, the grain boundaries have reduced negative effects on the operational performance of the access transistor 104 as the multiple grain region 144 is utilized to form the drain region 152 which contacts an overlying charge storage device 106 via a drain contact 154.

The transistor body 132 as partially overlying the data/bit lines 116 also define source regions 146 positioned generally at the lower regions of the transistor body 132. The drain regions 152 are positioned at upper regions of the transistor body 132 and in certain embodiments at least partially comprise the multiple grain region 144. As can be seen in FIG. 8C, as the access transistor 104 is offset from alignment atop the corresponding data/bit line 116, the source region 146 extends along the lower extent of the transistor body 132 along one side 156 of the transistor body 132 and across approximately half of the adjacent sides. The source region 146 generally is defined by the portions of the lower regions of the transistor body 132 which overly the associated data/bit line 116. Thus, the source region is present on a first side of the transistor body 132 and substantially absent on the opposite side and extends approximately halfway in-between.

A continuous conductive path 170 (FIG. 8C) is also defined in the data/bit lines 116 extending adjacent the source regions 146. The continuous conductive path 170 provides conductive regions of the data/bit lines 116 that are not significantly involved in the transistor operation of the transistors 104. This improves the conduction characteristics of the data/bit lines 116 and facilitates further aggressive scaling of the array 100.

Figure 9A:
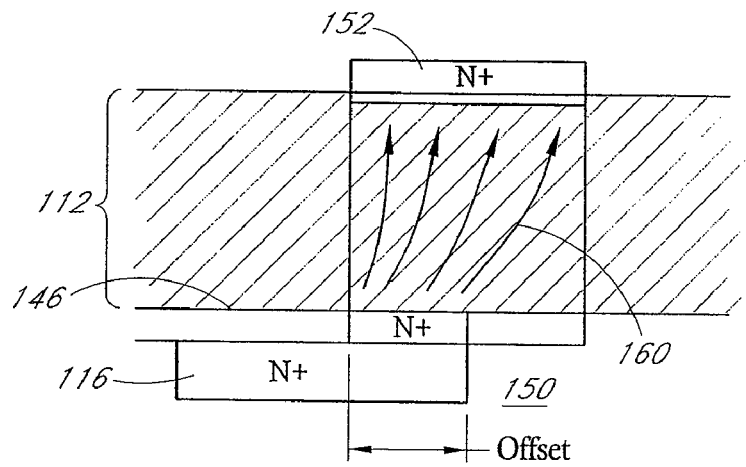
FIGS. 9A, 9B, and 9C are side, front, and rear views respectively of surface conduction channels arising in certain embodiments under appropriate applied potentials.
Figure 9B:
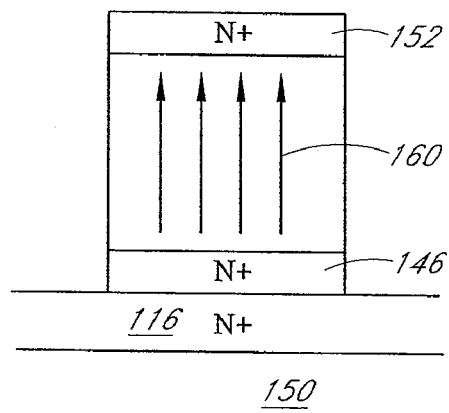
Figure 9C:
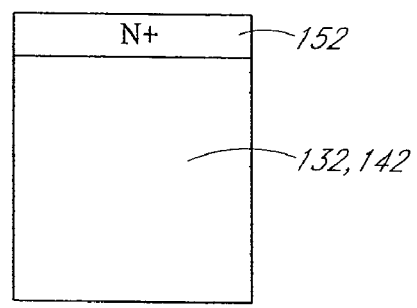

As illustrated schematically in FIGS. 9A, 9B, and 9C in side, front, and back views respectively, the source region 146 defines a relatively narrow region in lateral extent as compared to a relatively wide drain region 152. Again, the source region 146 is generally defined by the overlap of the access transistor 104 and more particularly the transistor body 132 over the underlying data/bit line 116. Under appropriate application of operating potentials by the word lines 112 and data/bit lines 116, conduction channels 160 will form along the surface of the transistor body 132 and more particularly along the single crystalline body region 142. Current will thus fan out from the source region configured generally as a U or C-shaped region at approximately one-half the perimeter of the lower extent of the transistor body 132 upwards to the generally larger and planar drain region 152. The rearward or back side portion of the transistor body 132 does not overlap the underlying data/bit line 116 and thus has significantly less contribution to the formation of the conduction channels 160. However, potential applied via the word lines 112 will be communicated by the surround gate structure 138 to more effectively control potential in the central pillar 130 for more reliable switching of the transistor 104 off and on.

Figure 10A:
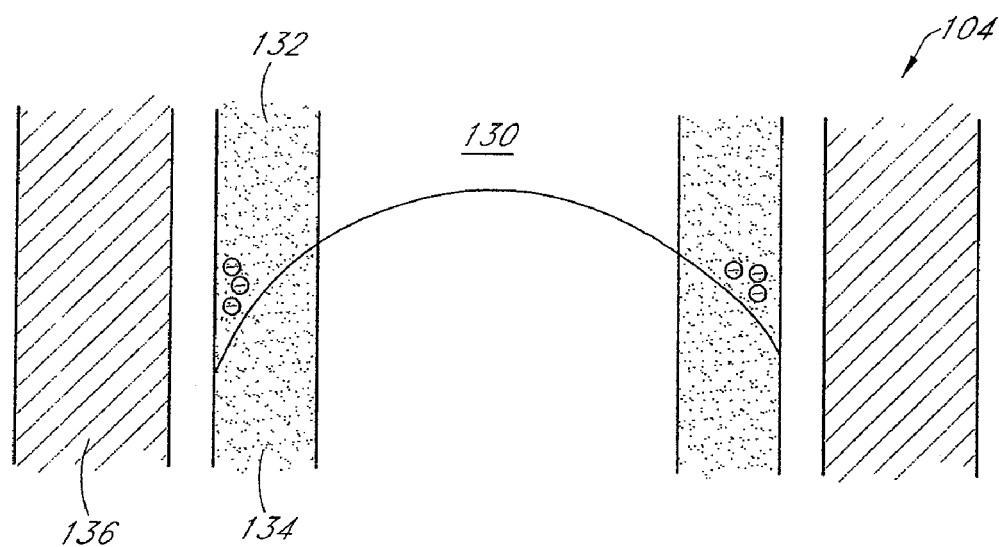
FIG. 10A illustrates another embodiment of an ultra-thin body transistor wherein the body is configured generally as a solid pillar.
Figure 10B:
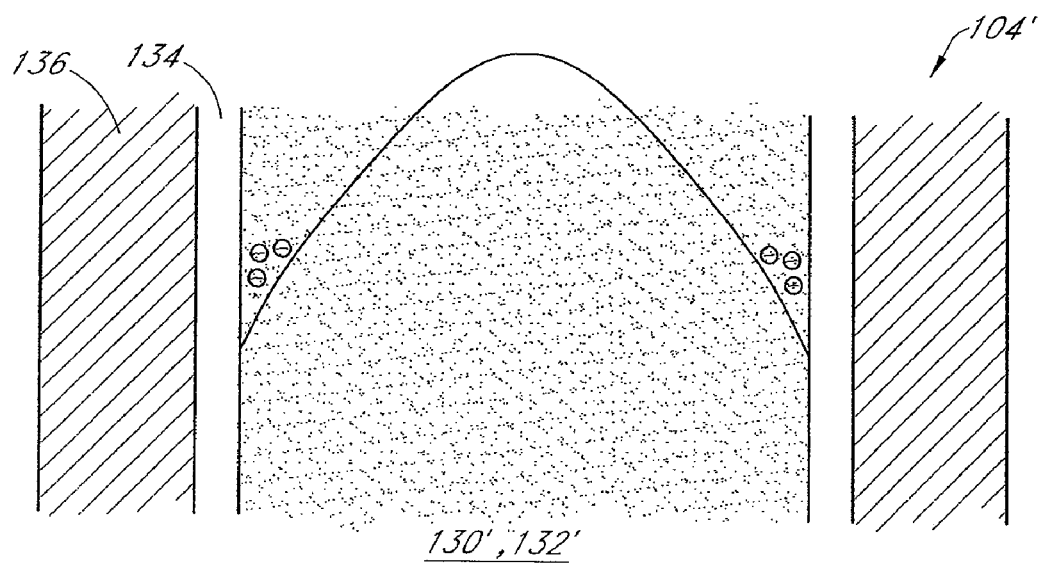
FIG. 10B illustrates another embodiment of a grown ultra-thin body transistor wherein the body is configured generally as an annular structure encompassing a vertical pillar.

FIGS. 10A and 10B illustrate schematically two embodiments of access transistor 104 and illustrate generally electron potential distributions in the access transistor 104. More particularly, FIG. 10A illustrates in side section view one embodiment of the access transistor 104 wherein the central pillar 130 comprises oxide and the transistor body 132 is configured as an annular vertically extending structure encompassing the central pillar 130. In this embodiment, the annular transistor body 132 comprises doped silicon. The pillar 130 comprising silicon oxide has a lower dielectric constant than the silicon forming the transistor body 132. In addition, there are substantially no ionized impurity dopant atoms in the oxide pillar 130 in contrast to the composition of the annular transistor body 132. This leads to differences in the potential distributions and indicated gate potentials for the embodiments illustrated in FIGS. 10A and 10B as described below.

FIG. 10B illustrates another embodiment of an access transistor 104' wherein the central pillar 130 and transistor body 132 are merged into a single ultra thin pillar which also provides the transistor body 132 of the access transistor 104'. As can be seen in a comparison of FIGS. 10a and 10b, potential variations through the silicon pillar 130, 132 of the access transistor 104' will be greater than in the separate transistor body 132 and central oxide pillar 130. In both embodiments, however, transistor action of the access transistor 104 and 104' will be similar and the conduction channels 160 will form at the surface of the transistor body 132 or combined pillar 130' and transistor body 132' underneath the adjacent gate dielectric structures 134. The operational characteristics of the access transistor 104 will describe a generally steeper sub-threshold slope than for the access transistor 104'.

The combined pillar 130' and transistor body 132' of the access transistor 104' will also typically exhibit more body charge than in the access transistor 104 wherein the central pillar 130 comprises oxide and the transistor body 132 is separate and comprises silicon. Thus, generally a lower gate voltage will be required for operation of the access transistor 104 as compared to the access transistor 104'. The difference in appropriate gate voltage to operate the access transistors 104, 104' will vary depending on the specifics of particular applications. In one embodiment, approximately 30 percent lower gate voltages would be indicated for the embodiment of access transistor 104, such as illustrated in FIG. 10A having a central pillar 130 comprising oxide with an annular transistor body 132 as compared to the appropriate gate voltages for the embodiment of access transistor 104', such as illustrated in FIG. 10B. The lower gate voltage typically required to operate the embodiment of access transistor 104, such as illustrated in FIG. 10A, is obtained at the expense of increased steps in the fabrication of this embodiment, as will be described in greater detail below.

Figure 11:
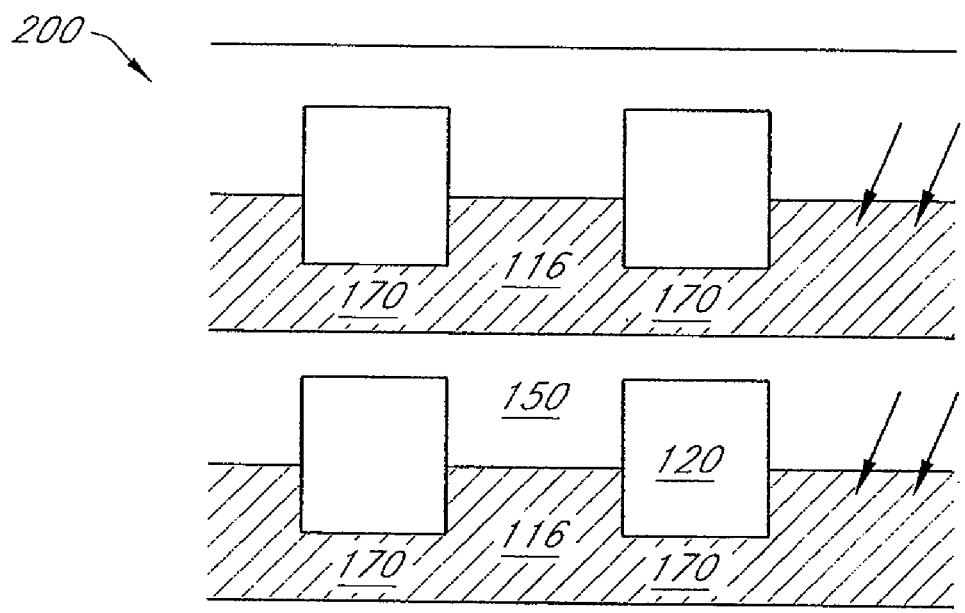
FIGS. 11 through 14 illustrate embodiments of methods of fabrication of a memory array.

FIGS. 11 through 14 illustrate embodiments of a method 200 of forming a memory array 100 including the access transistors 104 previously described. As shown in FIG. 11, an implant procedure 202 is performed to form the plurality of data/bit lines 116. In one particular embodiment, the implant 202 is performed with implant parameters of approximately $1\times10^{15}/cm^2$ of boron at approximately 20 keV. The pillars 130 are then formed to extend upwards from an upper surface of the substrate 150 and to at least partially overlie the underlying implanted data/bit lines 116. In one particular embodiment, the pillars 130 are formed such that approximately one-half of the pillar 130 overlies the associated varied data/bit line 116. Additional details of embodiments of forming the pillars 130 may be found in the co-pending application Ser. No. 11/129,502 filed May 13, 2005 which is incorporated herein by reference in its entirety.

Figure 12:
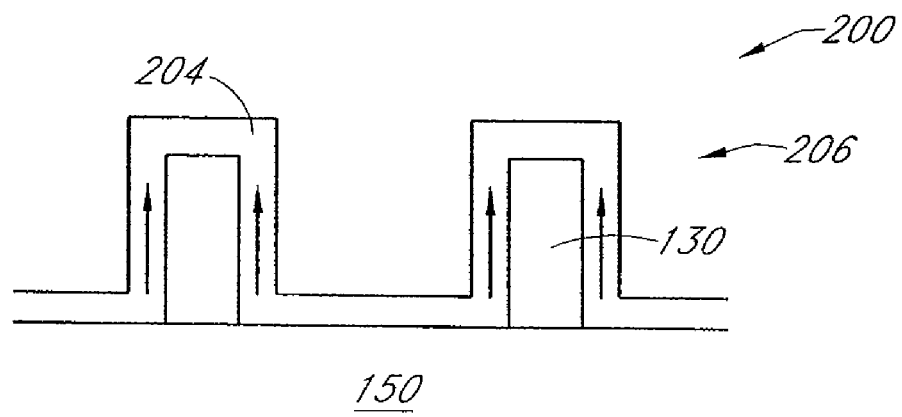

FIG. 12 illustrates subsequent steps in one embodiment of the method 200 wherein a layer of amorphous silicon is deposited as indicated by the reference number 204 so as to overly the upper surface of the substrate 150 as well as the plurality of vertically extending pillars 130. The thickness of amorphous silicon doped with boron 204 deposited will vary depending on the indications of particular applications, however, in one embodiment, comprises a deposition of approximately 20 nm. The amorphous silicon 204 is then recrystallized as indicated by the reference number 206 to form the single crystalline body region 142 by a solid phase epitaxial growth process 206. In one embodiment, the solid phase epitaxial growth process 206 proceeds at parameters of approximately 750° C. Since the pillars 130 are relatively short, in certain embodiments having a height H of 100 nanometers or less, the solid phase epitaxial growth 206 can readily grow the single crystalline structure 142 over such relatively short distances. As previously noted, in certain embodiments at the upper regions of the transistor body 132, a multiple grain region 144 is formed wherein the amorphous silicon 204 is transformed to a polycrystalline silicon structure having grain boundaries. However, this multi-grain region 144 will have relatively benign impact on the overall performance of the access transistor 104 as the drain contact 154 to an overlying charge storage device 106 is formed in this multiple grain region 144.

Figure 13:
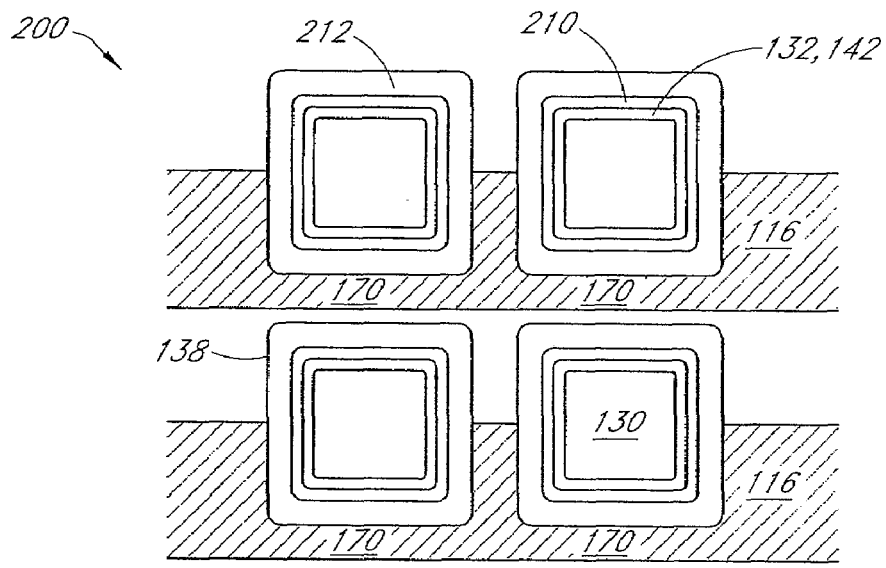

FIG. 13 illustrates schematically in top view further steps of one embodiment of a method 200 for forming the array 100 comprising the plurality of access transistors 104. FIG. 13 illustrates that the previously deposited amorphous silicon 204 has been transformed via a solid phase epitaxial growth process 206 to define the transistor body 132 including the single crystalline body region 142. Following this, a gate dielectric formation step 210 is performed wherein the gate dielectric 134 is grown or deposited in a well known manner to encompass the transistor body 132. In a gate conductor formation step 212 is performed to define the gate conductor structure 136. In one particular embodiment, the gate conductor formation 212 comprises depositing polysilicon and performing a directional or anisotropic edge, such that the gate dielectric 134 and overlying gate conductor 136 are formed on the sidewalls of the transistor body 132 to define the surround gate structure 138.

Figure 14:
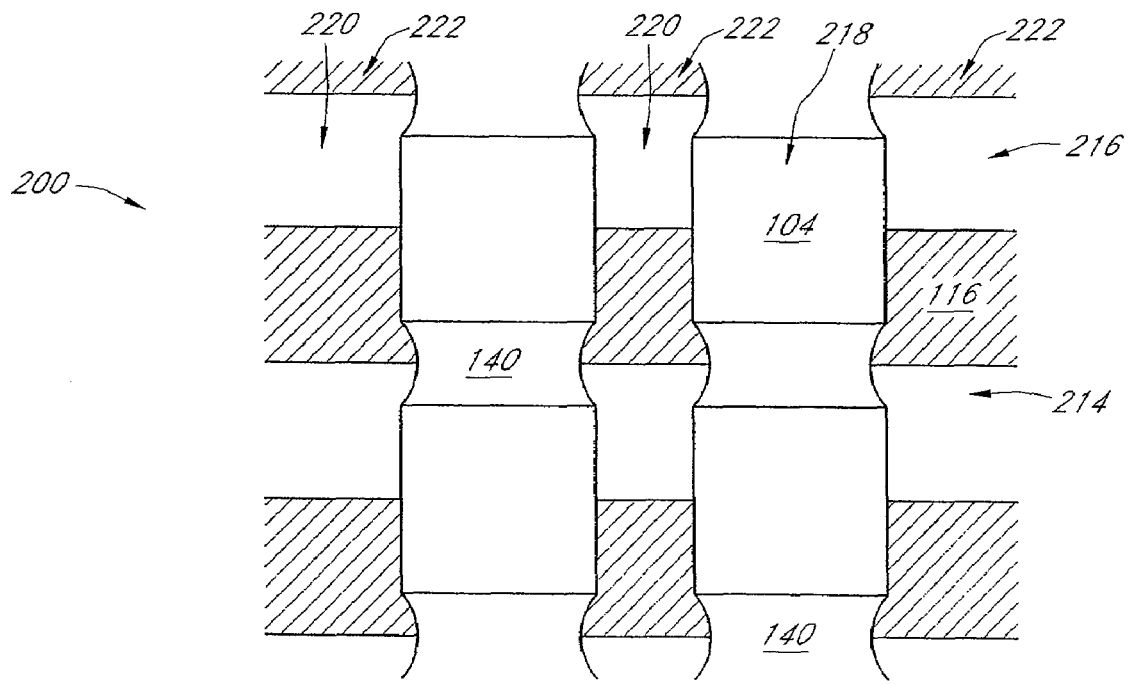

FIG. 14 illustrates one embodiment of further steps in the method 200 of forming a memory array 100. In this embodiment, an isolation step 214 is performed wherein dielectric material, such as silicon oxide, is filled in the interstitial spaces between adjacent access transistors 104. Following the isolation step 214, a planarization step 216 is performed in one embodiment by a chemical mechanical planarization/polishing (CMP) process. An implantation 218 of arsenic of approximately $1\times10^{15}/cm^2$ is performed into the top of the pillars 130 to form the doped drain regions 152. A trench formation step 220 is then performed to define a plurality of elongate trenches extending generally in the column direction between adjacent columns of the access transistors 104. Then a word line formation step 222 is performed wherein polysilicon and/or metal is deposited and directionally etched to form the address or word lines 112 positioned along the side walls of the trenches and in contact with the surround gate structures 138. The remainder of the structures for formation of the memory array 100, for example, including formation of the overlying charge storage devices 106, passivation, and formation of interconnect wiring then proceeds according to well known conventional techniques.

Thus, various embodiments provide an array of access transistors 104 which have a generally annular vertically extending transistor body having relatively thin side walls, in certain embodiments of a thickness of approximately 20 nm. This provides access transistors 104 which can accommodate continued aggressive scaling with reduced need for relatively high doping levels to suppress short channel effects. Certain embodiments also avoid the requirement for fabricating the access transistors 104 at sub-lithographic dimensions as the transistor body 132 is grown rather than etched. A solid phase epitaxial growth process can provide a single crystalline body region 142 of ultra-thin dimensions in a manner that is easier to fabricate than alternative processes and structures.

Although the foregoing description of the preferred embodiment of the present invention has shown, described, and pointed out the fundamental novel features of the invention, it will be understood that various omissions, substitutions, and changes in the form of the detail of the apparatus as illustrated, as well as the uses thereof, may be made by those skilled in the art without departing from the spirit of the present invention.

What is claimed is:

1. A method of forming transistor structures comprising:
   forming a pillar vertically extending from a surface of a substrate;
   growing a single crystalline semiconductive transistor body to extend vertically around the pillar;
   forming a surround gate structure around the transistor body;

forming a source region adjacent lower portions of the transistor body;

forming a drain region adjacent an upper portion of the transistor body; and forming a multiple grain region adjacent the upper portion of the single crystalline body so as to extend across a top of the pillar and wherein the drain region is formed to at least partially occupy the multiple grain region.

2. The method of claim 1, wherein growing the single crystalline transistor body comprises performing a solid phase epitaxial growth process.

3. The method of claim 1, further comprising forming a first conductor in the surface of the substrate and wherein the pillar and body are formed offset from the first conductor so as partially overlie the first conductor with a remainder extending beyond the first conductor.

4. The method of claim 3, wherein the source region is formed as a c-shaped region defined generally by the overlap of the body over the first conductor and wherein a continuous conductive path is defined in the first conductor extending adjacent the source region.

5. A method of forming transistor structures comprising:
forming a vertical extension from a surface;
growing a single crystalline semiconductive transistor body to extend vertically around the vertical extension;
forming a surround gate structure around the transistor body;
forming a source region adjacent lower portions of the transistor body;
forming a drain region adjacent an upper portion of the transistor body; and
forming a multiple grain region adjacent the upper portion of the single crystalline body so as to extend across a top of the vertical extension.

6. The method of claim 5 wherein the drain region is formed to at least partially occupy the multiple grain region.

7. The method of claim 5, wherein growing the single crystalline transistor body comprises performing a solid phase epitaxial growth process.

8. The method of claim 5, further comprising forming a first conductor in the surface of the substrate and wherein the vertical extension and body are formed offset from the first conductor so as to partially overlie the first conductor with a remainder extending beyond the first conductor.

9. The method of claim 8, wherein the source region is formed as a c-shaped region defined generally by the overlap of the body over the first conductor and wherein a continuous conductive path is defined in the first conductor extending adjacent the source region.

10. The method of claim 9, wherein a continuous conductive path is defined in the first conductor extending adjacent the source region.

11. A method of forming transistor structures comprising:
forming a vertical extension from a surface;
growing a crystalline semiconductive transistor body to extend vertically around the vertical extension;
forming a surround gate structure around the transistor body;
forming a source region at lower portions of the transistor body;
forming a drain region at an upper portion of the transistor body; and
forming a multiple grain region at the upper portion of the crystalline body so as to extend across a top of the vertical extension.

12. The method of claim 11 wherein the drain region is formed to at least partially occupy the multiple grain region.

13. The method of claim 11, wherein growing the crystalline transistor body comprises performing a solid phase epitaxial growth process.

14. The method of claim 11, further comprising forming a first conductor in the surface and wherein the vertical extension and body are formed offset from the first conductor so as partially overlie the first conductor with a remainder extending beyond the first conductor.

15. The method of claim 14, wherein the source region is formed as a c-shaped region defined generally by the overlap of the body over the first conductor and wherein a continuous conductive path is defined in the first conductor extending adjacent the source region.

16. The method of claim 15, wherein a continuous conductive path is defined in the first conductor extending adjacent the source region.

17. A method of forming transistor structures comprising:
forming a pillar vertically extending from a surface of a substrate;
growing a single crystalline semiconductive transistor body to extend vertically around the pillar;
forming a surround gate structure around the transistor body;
forming a source region adjacent lower portions of the transistor body;
forming a drain region adjacent an upper portion of the transistor body; and
forming a first conductor in the surface of the substrate wherein the pillar and body are formed offset from the first conductor so as partially overlie the first conductor with a remainder extending beyond the first conductor.

18. The method of claim 17, wherein growing the single crystalline transistor body comprises performing a solid phase epitaxial growth process.

19. The method of claim 17, wherein the source region is formed as a c-shaped region defined generally by the overlap of the body over the first conductor and wherein a continuous conductive path is defined in the first conductor extending adjacent the source region.

20. A method of forming transistor structures comprising:
forming a vertical extension from a surface;
growing a single crystalline semiconductive transistor body to extend vertically around the vertical extension;
forming a surround gate structure around the transistor body;
forming a source region adjacent lower portions of the transistor body;
forming a drain region adjacent an upper portion of the transistor body; and
forming a first conductor in the surface of the substrate and wherein the vertical extension and body are formed offset from the first conductor so as to partially overlie the first conductor with a remainder extending beyond the first conductor.

21. The method of claim 20 wherein the drain region is formed to at least partially occupy the multiple grain region.

22. The method of claim 20, wherein growing the single crystalline transistor body comprises performing a solid phase epitaxial growth process.

23. The method of claim 20, wherein the source region is formed as a c-shaped region defined generally by the overlap of the body over the first conductor and wherein a continuous conductive path is defined in the first conductor extending adjacent the source region.

24. The method of claim 23, wherein a continuous conductive path is defined in the first conductor extending adjacent the source region.

25. A method of forming transistor structures comprising:
forming a vertical extension from a surface;
growing a crystalline semiconductive transistor body to extend vertically around the vertical extension;
forming a surround gate structure around the transistor body;
forming a source region at lower portions of the transistor body;
forming a drain region at an upper portion of the transistor body; and
forming a first conductor in the surface and wherein the vertical extension and body are formed offset from the first conductor so as partially overlie the first conductor with a remainder extending beyond the first conductor.

26. The method of claim 25 wherein the drain region is formed to at least partially occupy the multiple grain region.

27. The method of claim 25, wherein growing the crystalline transistor body comprises performing a solid phase epitaxial growth process.

28. The method of claim 25, wherein the source region is formed as a c-shaped region defined generally by the overlap of the body over the first conductor and wherein a continuous conductive path is defined in the first conductor extending adjacent the source region.

29. The method of claim 28, wherein a continuous conductive path is defined in the first conductor extending adjacent the source region.

* * * * *